US011322589B2

(12) United States Patent
Yang et al.

(10) Patent No.: US 11,322,589 B2
(45) Date of Patent: May 3, 2022

(54) SEMICONDUCTOR DEVICE

(71) Applicant: Samsung Electronics Co., Ltd., Suwon-si (KR)

(72) Inventors: Jung Gil Yang, Suwon-si (KR); Seung Min Song, Suwon-si (KR); Soo Jin Jeong, Suwon-si (KR); Dong Il Bae, Suwon-si (KR); Bong Seok Suh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/752,418

(22) Filed: Jan. 24, 2020

(65) Prior Publication Data

US 2020/0388678 A1 Dec. 10, 2020

(30) Foreign Application Priority Data

Jun. 10, 2019 (KR) ........................ 10-2019-0067746

(51) Int. Cl.
*H01L 29/78* (2006.01)
*H01L 29/66* (2006.01)
*H01L 21/308* (2006.01)
*H01L 21/02* (2006.01)
*H01L 21/3065* (2006.01)
*H01L 29/08* (2006.01)
*H01L 29/04* (2006.01)
*H01L 29/786* (2006.01)

(52) U.S. Cl.
CPC ........ *H01L 29/0847* (2013.01); *H01L 29/045* (2013.01); *H01L 29/78696* (2013.01)

(58) Field of Classification Search
CPC ... H01L 21/8238; H01L 27/092; H01L 29/06; H01L 29/423; H01L 29/786; H01L 27/12; H01L 21/306; H01L 21/762; H01L 21/02; H01L 21/308; H01L 29/66; H01L 31/0392
See application file for complete search history.

(56) References Cited

U.S. PATENT DOCUMENTS

| | | | |
|---|---|---|---|
| 7,402,483 B2 | 7/2008 | Yun et al. | |
| 8,659,032 B2 | 2/2014 | Chao et al. | |
| 9,391,172 B2 | 7/2016 | Hwang et al. | |
| 9,543,441 B2 | 1/2017 | Lee et al. | |

(Continued)

*Primary Examiner* — Brian Turner
(74) *Attorney, Agent, or Firm* — Muir Patent Law, PLLC

(57) ABSTRACT

Provided is a semiconductor device comprising an active region on a substrate and including first and second sidewalls extending in a first direction and an epitaxial pattern on the active region, wherein the epitaxial pattern includes first and second epitaxial sidewalls extending from the first and second sidewalls, respectively, the first epitaxial sidewall includes a first epitaxial lower sidewall, a first epitaxial upper sidewall, and a first epitaxial connecting sidewall connecting the first epitaxial lower sidewall and the first epitaxial upper sidewall, the second epitaxial sidewall includes a second epitaxial lower sidewall, a second epitaxial upper sidewall, and a second epitaxial connecting sidewall connecting the second epitaxial lower sidewall and the second epitaxial upper sidewall, a distance between the first and second epitaxial upper sidewalls decreases away from the active region, and the first and second epitaxial lower sidewalls extend in parallel to a top surface of the substrate.

9 Claims, 31 Drawing Sheets

(56) References Cited

U.S. PATENT DOCUMENTS

| | | | |
|---|---|---|---|
| 9,978,749 B2 | 5/2018 | Li | |
| 2012/0132957 A1* | 5/2012 | Sung | H01L 21/823807 |
| | | | 257/192 |
| 2015/0214369 A1* | 7/2015 | Fronheiser | H01L 29/16 |
| | | | 257/192 |
| 2015/0380411 A1* | 12/2015 | Yin | H01L 21/265 |
| | | | 257/369 |
| 2016/0093741 A1* | 3/2016 | Yang | H01L 29/41791 |
| | | | 257/288 |
| 2018/0033882 A1 | 2/2018 | Sung et al. | |
| 2018/0090608 A1 | 3/2018 | Yu et al. | |
| 2018/0212044 A1 | 7/2018 | Lo et al. | |
| 2018/0342583 A1 | 11/2018 | Yu et al. | |
| 2019/0164966 A1* | 5/2019 | Wang | H01L 21/823814 |
| 2019/0165174 A1* | 5/2019 | Peng | H01L 29/785 |
| 2019/0312143 A1* | 10/2019 | Lin | H01L 21/02532 |
| 2019/0341448 A1* | 11/2019 | Bourjot | H01L 29/0653 |
| 2020/0006154 A1* | 1/2020 | Chiang | H01L 29/42392 |
| 2020/0243544 A1* | 7/2020 | Shih | H01L 29/66795 |

\* cited by examiner

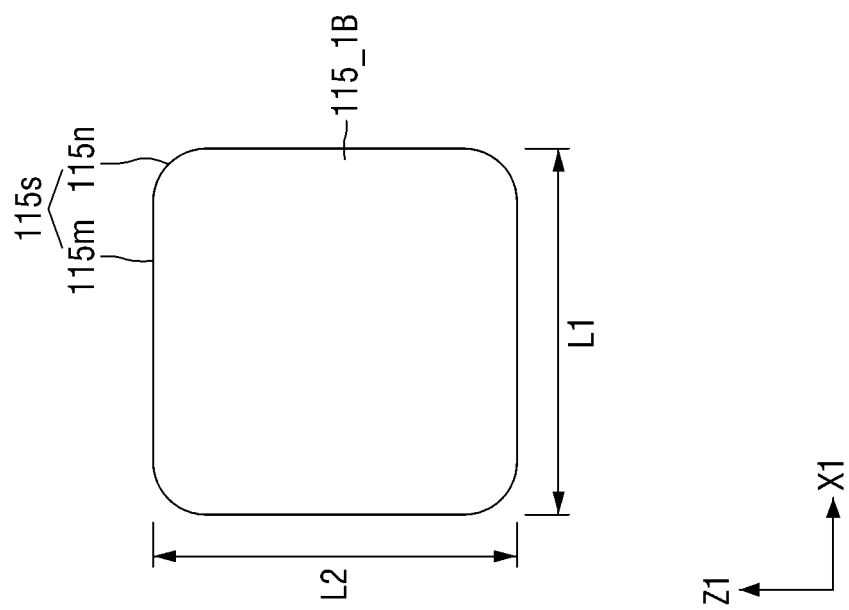

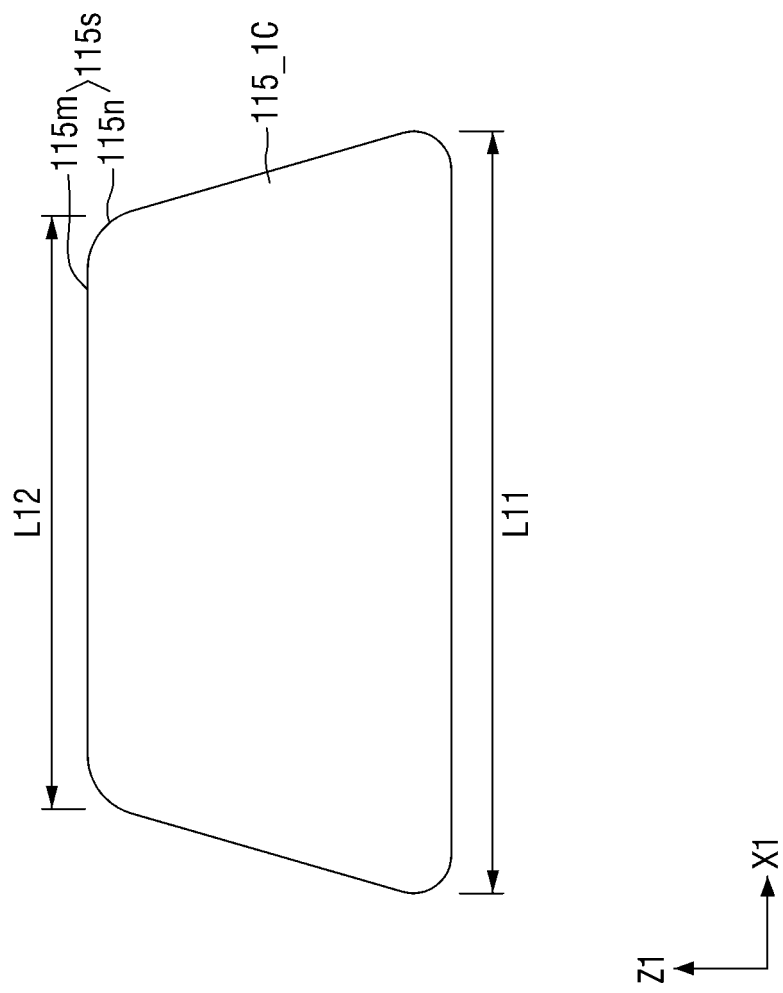

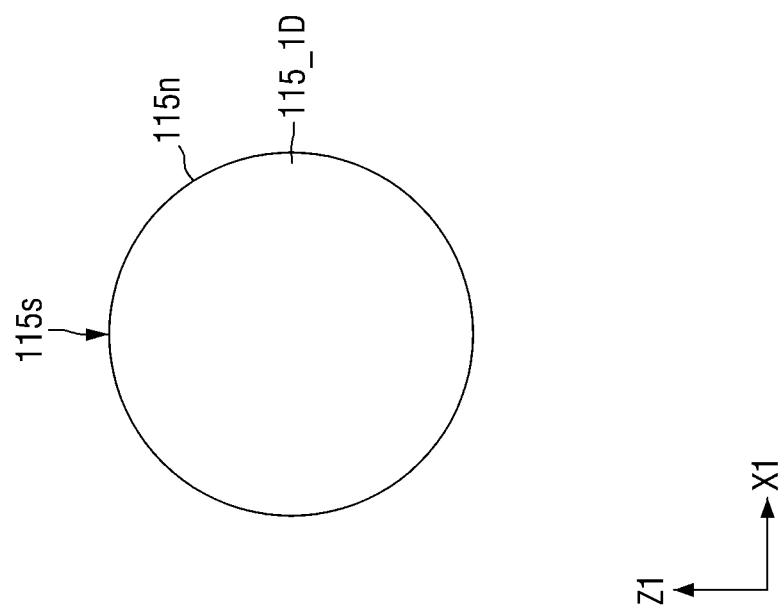

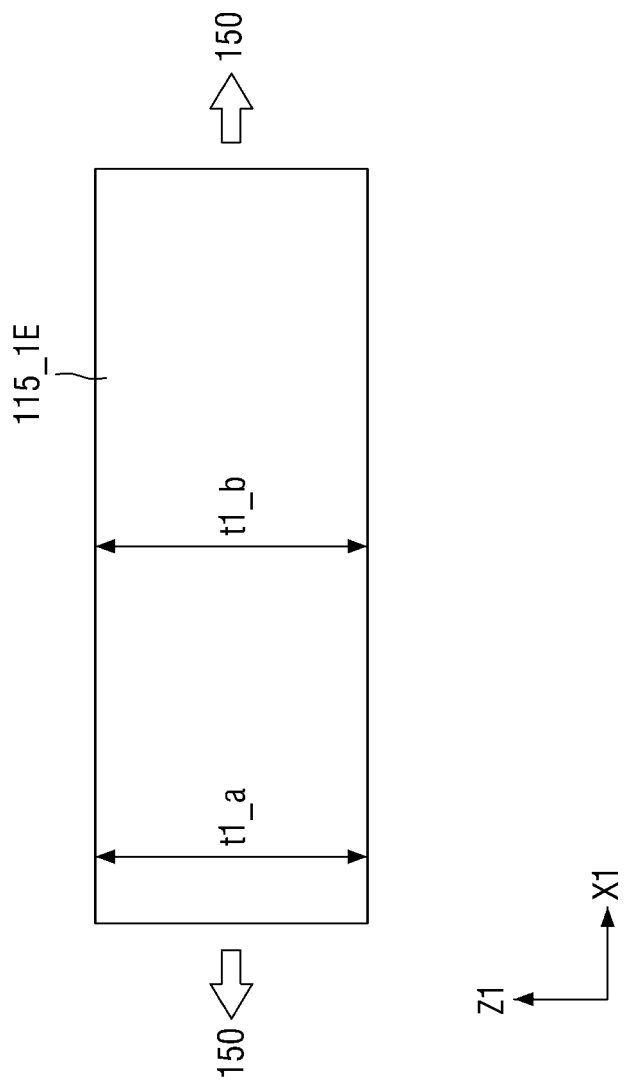

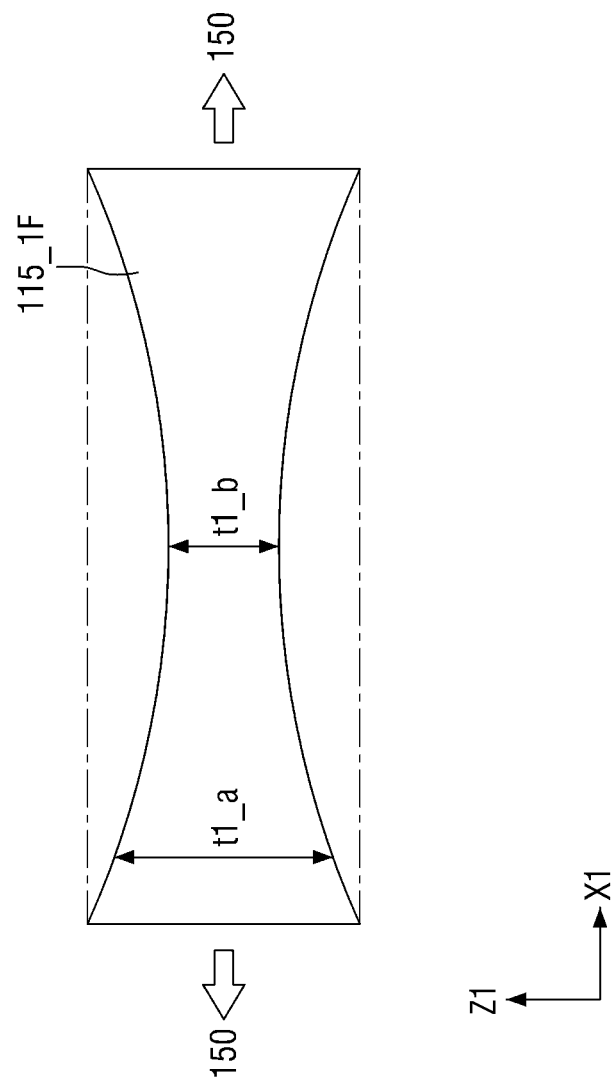

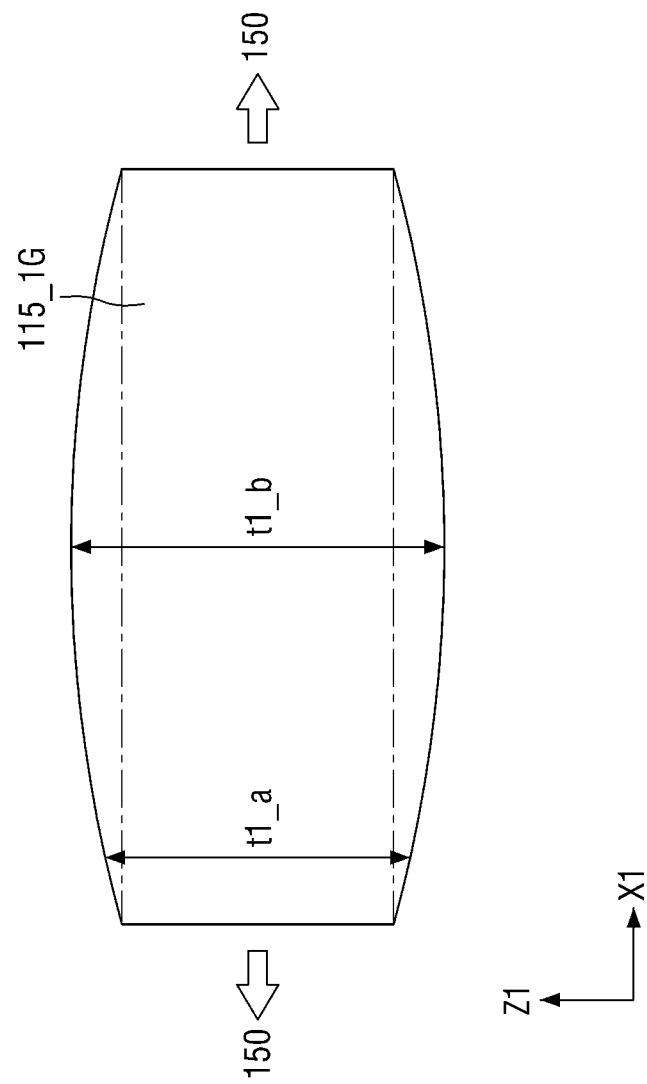

SEMICONDUCTOR DEVICE

CROSS-REFERENCE TO RELATED APPLICATION

This application claims priority to Korean Patent Application No. 10-2019-0067746, filed on Jun. 10, 2019, in the Korean Intellectual Property Office, the disclosure of which is incorporated herein by reference in its entirety.

BACKGROUND

1. Technical Field

The present inventive concept relates to a semiconductor device, and more particularly, to a semiconductor device having a gate-all-around structure.

2. Description of the Related Art

As a scaling technique for increasing the density of a semiconductor device, a gate-all-around structure has been suggested in which a nanowire-type silicon body is formed on a substrate and a gate is formed to surround the silicon body.

Since the gate-all-around structure uses a three-dimensional (3D) channel, scaling can be facilitated. Also, current control capability can be improved without increasing the length of the gate. Also, a short channel effect (SCE), i.e., the phenomenon of the potential of a channel region being affected by a drain voltage, can be effectively suppressed.

SUMMARY

Embodiments of the present inventive concept provide a semiconductor device capable of improving performance and reliability by controlling the shape of epitaxial patterns in a transistor having a gate-all-around structure.

However, embodiments of the present inventive concept are not restricted to those set forth herein. The above and other embodiments of the present inventive concept will become more apparent to one of ordinary skill in the art to which the present inventive concept pertains by referencing the detailed description of the present inventive concept given below.

According to an example of the present inventive concept, the disclosure is directed to a semiconductor device comprising: an active region disposed on a substrate and including first and second sidewalls which extend in a first direction; and an epitaxial pattern disposed on the active region, wherein the epitaxial pattern includes first and second epitaxial sidewalls which extend from the first and second sidewalls, respectively, of the active region, wherein the first epitaxial sidewall includes a first epitaxial lower sidewall, a first epitaxial upper sidewall, and a first epitaxial connecting sidewall which connects the first epitaxial lower sidewall and the first epitaxial upper sidewall, wherein the second epitaxial sidewall includes a second epitaxial lower sidewall, a second epitaxial upper sidewall, and a second epitaxial connecting sidewall which connects the second epitaxial lower sidewall and the second epitaxial upper sidewall, wherein a distance between the first and second epitaxial upper sidewalls in a second direction perpendicular to the first direction decreases as a distance from the active region increases in a third direction, which is perpendicular to the first and second directions, and wherein the first and second epitaxial lower sidewalls extend in parallel to a top surface of the substrate.

According to an example of the present inventive concept, the disclosure is directed to a semiconductor device comprising: an active region including first and second sidewalls which extend in a first direction; and an epitaxial pattern disposed on the active region, wherein the epitaxial pattern includes first and second epitaxial sidewalls which extend from the first and second sidewalls, respectively, of the active region, wherein the first epitaxial sidewall includes a first epitaxial lower sidewall, a first epitaxial upper sidewall, and a first epitaxial connecting sidewall which connects the first epitaxial lower sidewall and the first epitaxial upper sidewall, wherein the second epitaxial sidewall includes a second epitaxial lower sidewall, a second epitaxial upper sidewall, and a second epitaxial connecting sidewall which connects the second epitaxial lower sidewall and the second epitaxial upper sidewall, wherein the first and second epitaxial upper sidewalls are formed by crystal planes included in a first crystal plane group, and wherein the first and second epitaxial connecting sidewalls are formed by crystal planes included in a second crystal plane group which is different from the first crystal plane group.

According to an example of the present inventive concept, the disclosure is directed to a semiconductor device comprising: a first active region disposed in a first region of a substrate and including first and second sidewalls which extend in a first direction; a second active region disposed in a second region of the substrate and including third and fourth sidewalls which extend in a second direction; a first epitaxial pattern disposed on the first active region; and a second epitaxial pattern disposed on the second active region, wherein the first epitaxial pattern includes first and second epitaxial sidewalls which extend from the first and second sidewalls, respectively, of the first active region, wherein the first epitaxial sidewall includes a first epitaxial lower sidewall, a first epitaxial upper sidewall, and a first epitaxial connecting sidewall which connects the first epitaxial lower sidewall and the first epitaxial upper sidewall, wherein the second epitaxial sidewall includes a second epitaxial lower sidewall, a second epitaxial upper sidewall, and a second epitaxial connecting sidewall which connects the second epitaxial lower sidewall and the second epitaxial upper sidewall, wherein the second epitaxial pattern includes third and fourth epitaxial sidewalls which extend from the third and fourth sidewalls, respectively, of the second active region, wherein the third epitaxial sidewall includes a third epitaxial lower sidewall and a third epitaxial upper sidewall which is directly connected to the third epitaxial lower sidewall, wherein the fourth epitaxial sidewall includes a fourth epitaxial lower sidewall and a fourth epitaxial upper sidewall which is directly connected to the fourth epitaxial lower sidewall, wherein the first to fourth epitaxial upper sidewalls and the third and fourth epitaxial lower sidewalls are formed by crystal planes included in a first crystal plane group, and wherein the first and second epitaxial lower sidewalls are formed by crystal planes included in a second crystal plane group.

BRIEF DESCRIPTION OF THE DRAWINGS

The above and other embodiments and features of the present inventive concept will become more apparent by describing in detail embodiments thereof with reference to the attached drawings, in which:

FIGS. 5A, 5B, 5C, and 5D are cross-sectional views, taken along line B-B, of various examples of a first nanosheet of FIG. 1;

FIGS. 6A, 6B, and 6C are cross-sectional views, taken along line A-A, of various examples of the first nanosheet of FIG. 1;

DETAILED DESCRIPTION

The accompanying drawings illustrate a gate-all-around field-effect transistor (GAAFET) including a nanowire- or nanosheet-type channel region, but the present inventive concept is not limited thereto.

A semiconductor device according to some embodiments of the present inventive concept will hereinafter be described with reference to FIGS. 1 through 7.

Figure 1:
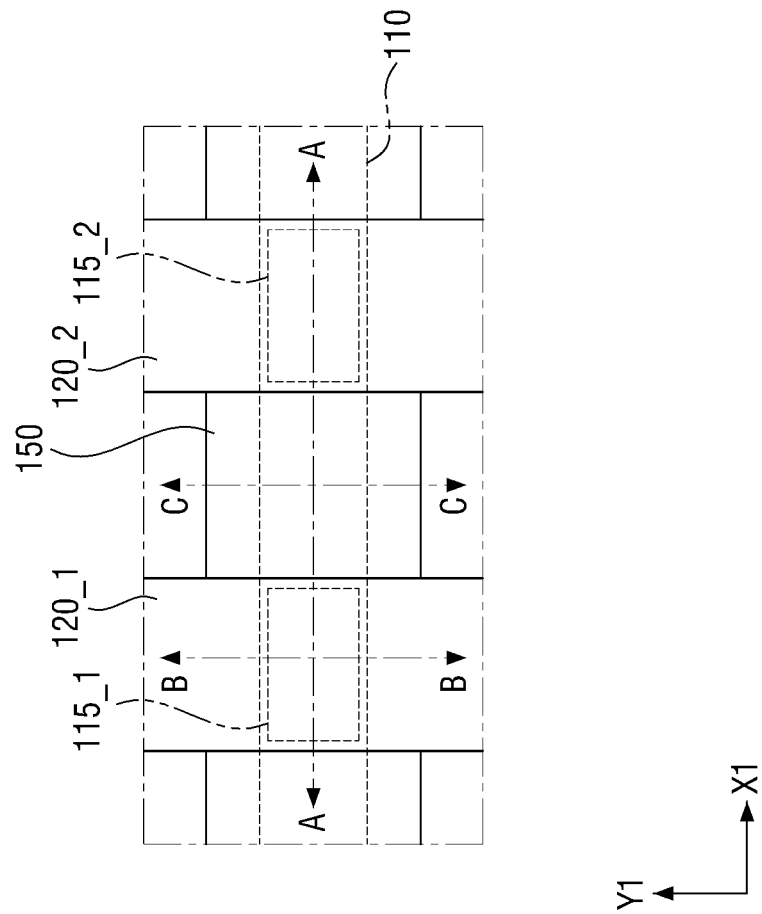
FIG. 1 is a plan view illustrating a semiconductor device according to some embodiments of the present inventive concept.
Figure 2:
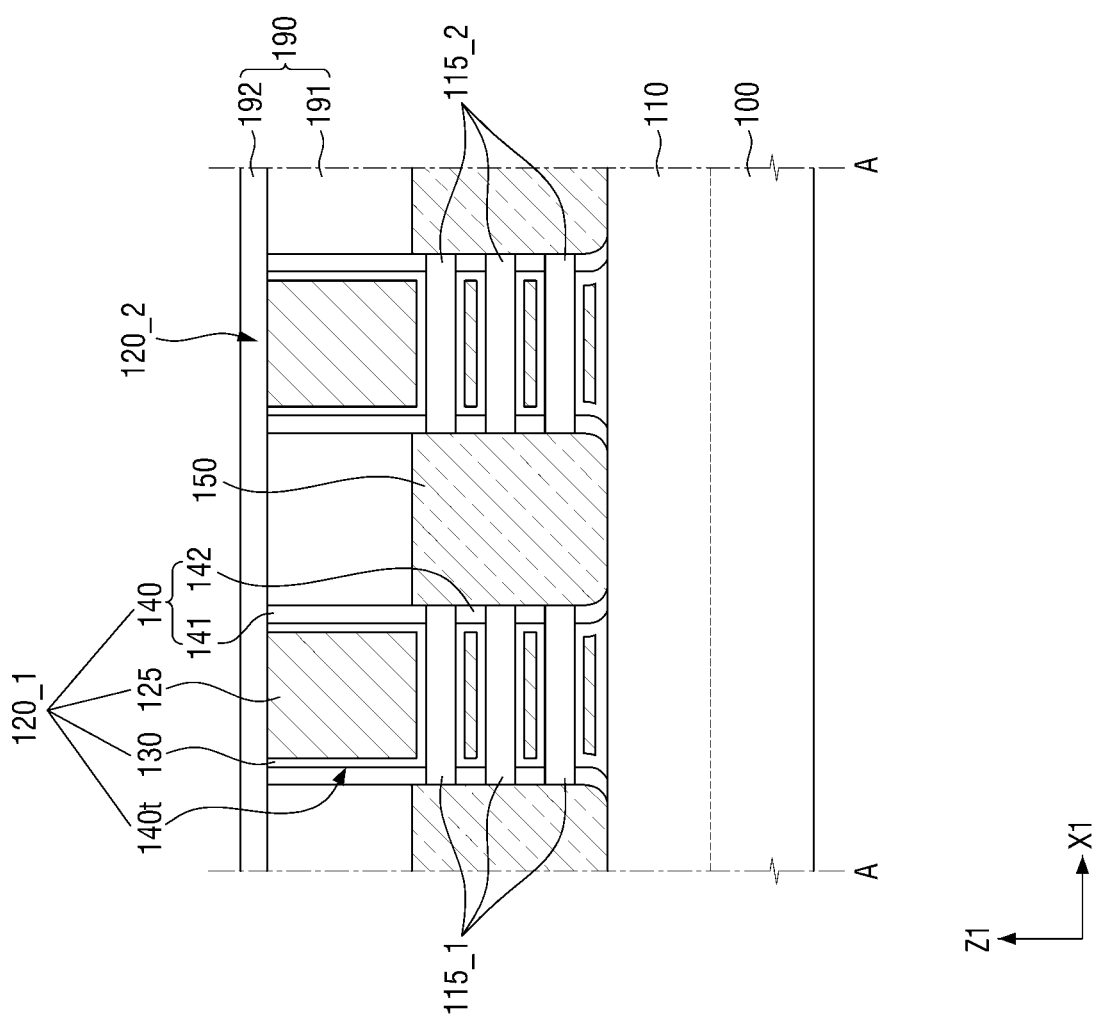
FIGS. 2, 3, and 4 are cross-sectional views taken along lines A-A, B-B, and C-C, respectively, of FIG. 1.
Figure 3:
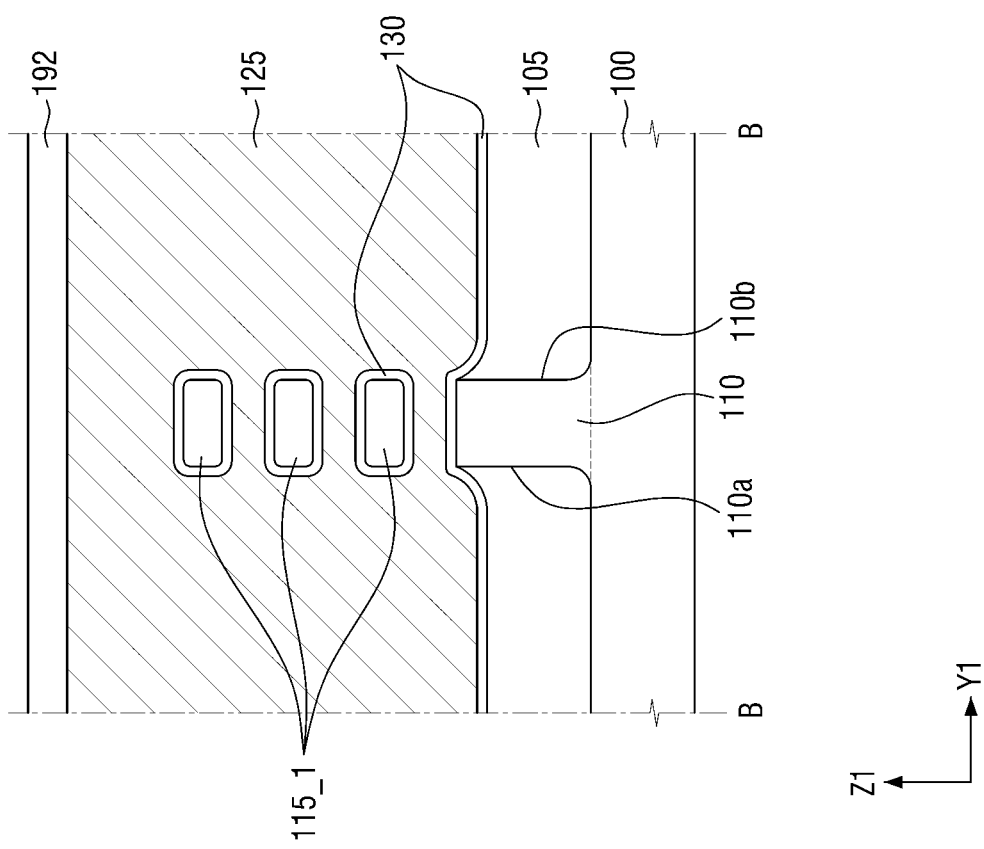
Figure 4:
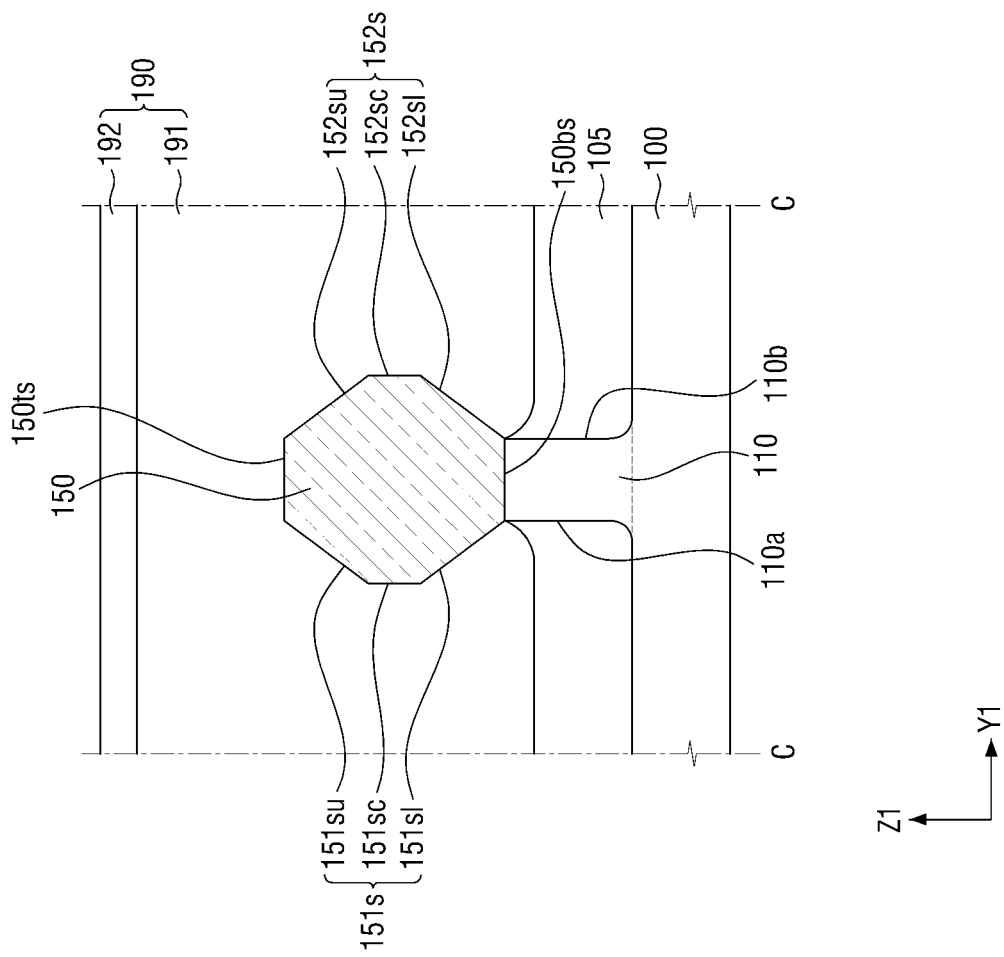

FIG. 1 is a plan view illustrating a semiconductor device according to some example embodiments of the present inventive concept. FIGS. 2 through 4 are cross-sectional views taken along lines A-A, B-B, and C-C, respectively, of FIG. 1. FIGS. 5A through 5D are cross-sectional views, taken along line B-B, of various examples of a nanosheet of FIG. 1. FIGS. 6A through 6C and 7 are cross-sectional views, taken along line A-A, of various examples of the first nanosheet of FIG. 1. For convenience, an interlayer insulating film 190 is not illustrated in FIG. 1.

Referring to FIGS. 1 through 4, the semiconductor device according to some example embodiments of the present inventive concept may include a first fin-type pattern 110, first nanosheets 115_1 and 115_2, first gate structures 120_1 and 120_2, and a first epitaxial pattern 150.

The substrate 100 may be a bulk silicon substrate or a silicon-on-insulator (SOI) substrate. Alternatively, the substrate 100 may be a silicon (Si) substrate or may include another material such as, for example, silicon germanium (SiGe), SiGe-on-insulator (SGOI), indium antimonide, a lead tellurium compound, indium arsenide, indium phosphide, gallium arsenide, or gallium antimonide, but the present inventive concept is not limited thereto.

The first fin-type pattern 110 may protrude from the substrate 100 (e.g., in a third direction Z1, which is perpendicular to a first direction X1 and a second direction Y1). The first fin-type pattern 110 may be disposed on the top surface of the substrate 100. The first fin-type pattern 110 may extend lengthwise in the first direction X1. The first fin-type pattern 110 may include first and second fin sidewalls 110a and 110b. The first and second fin sidewalls 110a and 110b may extend lengthwise in the first direction X1. The first and second sidewalls 110a and 110b may define the long sides of the first fin-type pattern 110. As used herein, an item, layer, or portion of an item or layer described as extending "lengthwise" in a particular direction has a length in the particular direction and a width perpendicular to that direction, where the length is greater than the width.

The first fin-type pattern 110 may be formed by etching part of the substrate 100 or may include an epitaxial layer grown from the substrate 100. The first fin-type pattern 110 may include an element semiconductor material, such as silicon (Si) or geranium (Ge). The first fin-type pattern 110 may include a compound semiconductor such as, for example, a group IV-IV compound semiconductor or a group III-V compound semiconductor.

The group IV-IV compound semiconductor may be a binary or ternary compound including at least two of, for example, carbon (C), silicon (Si), germanium (Ge), and tin (Sn) or a compound obtained by doping the binary or ternary compound with a group IV element. The group III-V compound semiconductor may be a binary, ternary, or quaternary compound obtained by combining a group III element such as aluminum (Al), gallium (Ga), and indium (In) and a group V element such as phosphorus (P), arsenic (As), and antimony (Sb).

The first fin-type pattern 110 may be a Si fin-type pattern including Si. Also, the first fin-type pattern 110 may be an active region. For example, the first and second sidewalls 110a and 110b may be the sidewalls of an active region.

FIGS. 3 and 4 illustrate that the first fin-type pattern 110 is formed as a single-layer film, but the present inventive concept is not limited thereto. For example, an upper part of the first fin-type pattern 110 may include a layer formed of a material other than Si.

A field insulating film 105 may be formed on the substrate 100. The field insulating film 105 may at least partially cover the first and second fin sidewalls 110a and 110b. For example, the field insulating film 105 may contact the first and second fin sidewalls 110a and 110b. The first fin-type pattern 110 may be defined by the field insulating film 105. The field insulating film 105 may include one of, for example, an oxide film, a nitride film, an oxynitride film, and a combination thereof. The field insulating film 105 may further include at least one field liner film, which is formed between the first fin-type pattern 110 and the field insulating film 105. In such a case, the field liner film may include at least one of polysilicon, amorphous silicon, silicon oxynitride, silicon nitride, and silicon oxide.

In some embodiments, the field insulating film 105 may generally cover the first and second fin sidewalls 110a and 110b. As used herein, the term "contact" refers to a direct connection (i.e., touching) unless the context indicates otherwise.

The first nanosheets 115_1 and 115_2 may be formed on the substrate 100. The first nanosheets 115_1 and 115_2 may be disposed on the first fin-type pattern 110. Each of the first nanosheets 115_1 and 115_2 may include a plurality of nanosheet layers which are sequentially arranged in the thickness direction of the substrate 100 (e.g., the third direction Z1). The plurality of nanosheet layers may be sequentially arranged on the first fin-type pattern 110. For example, the plurality of nanosheet layers of the first nanosheets 115_1 and the plurality of nanosheet layers of the first nanosheets 115_2 may be stacked on the first fin-type pattern 110 in the third direction Z1.

FIGS. 2 and 3 illustrate that three nanosheets are arranged in the thickness direction of the substrate 100 (e.g., the third direction Z1), but the present inventive concept is not limited thereto. For example, the first nanosheets 115_1 and 115_2 may include one first nanosheet 115_1 and one first nanosheet 115_2. As another example, the first nanosheets 115_1 and 115_2 may include two first nanosheets 115_1 and two first nanosheets 115_2. As an additional example, the first nanosheets 115_1 and 115_2 may include more than three first nanosheets 115_1 and more than three first nanosheets 115_2.

The first nanosheets 115_1 and 115_2 may be spaced apart from each other and may be arranged in the first direction X1 along the top surface of the first fin-type pattern 110. The first epitaxial pattern 150 may be disposed between the first nanosheets 115_1 and 115_2, which are spaced apart from each other in the first direction X1. The first epitaxial pattern 150 may contact side surfaces of each of the first nanosheets 115_1 and 115_2.

The first fin-type pattern 110 and the first nanosheets 115_1 and 115_2 may be formed by selectively removing part of a fin structure including the first fin-type pattern 110 and the first nanosheets 115_1 and 115_2. Thus, the width of the first nanosheets 115_1 and 115_2 in the second direction Y1 may be the same as, or smaller than, the width of the first fin-type pattern 110 in the second direction Y1.

The first nanosheets 115_1 and 115_2 may include an element semiconductor material such as Si or Ge. Also, the first nanosheets 115_1 and 115_2 may include a compound semiconductor such as, for example, a group IV-IV compound semiconductor or a group III-V compound semiconductor.

The first nanosheets 115_1 and 115_2 may be used as the channel regions of transistors including the first nanosheets 115_1 and 115_2. Each of the first nanosheets 115_1 and 115_2 stacked in the thickness direction of the substrate 100 may include the same material or different materials. For example, nanosheet layers of the first nanosheets 115_1 and 115_2 that are closest to the first fin-type pattern 110 and nanosheet layers of the first nanosheets 115_1 and 115_2 that are second closest to the first fin-type pattern 110 may include the same material or different materials.

The first nanosheets 115_1 and 115_2 may include the same material as, or a different material from, the first fin-type pattern 110.

The first nanosheets 115_1 and 115_2 may be used as the channel regions of P-type metal oxide semiconductor (PMOS) transistors.

The first gate structures 120_1 and 120_2 may extend lengthwise in the second direction Y1. The first gate structures 120_1 and 120_2 may intersect the first fin-type pattern 110. The first gate structures 120_1 and 120_2 may respectively intersect the first nanosheets 115_1 and 115_2, which are spaced apart from each other in the first direction X1. The first gate structures 120_1 and 120_2 may surround the first nanosheets 115_1 and 115_2, which are spaced apart from each other in the first direction X1.

Each of the first gate structures 120_1 and 120_2 may include a first gate electrode 125, a first gate insulating film 130, first gate spacers 140, and a first gate trench 140t.

The first gate spacers 140 may extend lengthwise in the second direction Y1. The first gate spacers 140 may intersect the first nanosheets 115_1 and 115_2. The first gate spacers 140 may define the first gate trench 140t which intersects the first nanosheets 115_1 and 115_2. The first gate spacers 140 may be disposed at both ends of the first nanosheets 115_1 and 115_2 which extend in the first direction X1. The first gate spacers 140 may be formed to face each other on both sides of the first nanosheets 115_1 and 115_2. The first gate spacers 140 may include penetrations that the first nanosheets 115_1 and 115_2 can pass through.

Each of the first nanosheets 115_1 and 115_2 can pass through the first gate spacers 140. The first gate spacers 140 may be in contact with circumferential portions of the respective first nanosheets 115_1 and 115_2. For example, the first gate spacers 140 may be in contact with portions of upper and lower surfaces at the outside edges of each of the first nanosheets 115_1 and 115_2.

The first gate spacers 140 may include first inner spacers 142 and first outer spacers 141. The first inner spacers 142 may be disposed between the first fin-type pattern 110 and the lowermost ones of the first nanosheets 115_1 and 115_2 and between the respective first nanosheets 115_1 and 115_2.

The first inner spacers 142 may be disposed at locations vertically overlapping with the respective first nanosheets 115_1 and 115_2. The first inner spacers 142 may not be formed on portions of the field insulating film 105 that do not overlap with the first nanosheets 115_1 and 115_2. For example, the first outer spacers 141 may be formed on the top surface of the field insulating film 105. The first outer spacers 141 may be formed on the uppermost nanosheet layer of the first nanosheets 115_1 and 115_2.

The first outer spacers 141 may include at least one of, for example, silicon nitride (SiN), silicon oxynitride (SiON), silicon oxide ($SiO_2$), silicon oxycarbonitride (SiOCN), and a combination thereof. The first inner spacers 142 may include at least one of, for example, SiN, SiON, $SiO_2$, SiOCN, silicon boronitride (SiBN), silicon oxyboronitride (SiOBN), silicon oxycarbide (SiOC), and a combination thereof. Referring to FIG. 2, the first outer spacers 141 and the first inner spacers 142 may be formed of the same material or different materials.

The first gate insulating film 130 may be formed along the edges of the respective first nanosheets 115_1 and 115_2.

The first gate insulating film 130 may surround the respective first nanosheets 115_1 and 115_2. The first gate insulating film 130 may also be formed on the top surface of the field insulating film 105 and on the first fin-type pattern 110. The first gate insulating film 130 may extend along the inside of the first gate spacers 140.

The first gate insulating film 130 may extend along the sidewalls and the bottom of the first gate trench 140t and the edges of the respective first nanosheets 115_1 and 115_2.

Although not specifically illustrated, an interfacial layer may be formed between the first gate insulating film 130 and the respective first nanosheets 115_1 and 115_2 and between the first gate insulating film 130 and the first fin-type pattern 110. The interfacial layer may have the same profile as the first gate insulating film 130, depending on how the interfacial layer is formed.

The first gate insulating film 130 may include at least one of silicon oxide, silicon oxynitride, silicon nitride, and a high-dielectric constant material having a bigger dielectric constant than silicon oxide. Examples of the high-dielectric constant material include hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first gate electrode 125 may intersect the first nanosheets 115_1 and 115_2, which are spaced apart from the substrate 100, and the first fin-type pattern 110. The first gate electrode 125 may surround the respective first nanosheets 115_1 and 115_2. The first gate electrode 125 may also be formed in a gap between the first nanosheets 115_1 and 115_2 and the first fin-type pattern 110. The first gate electrode 125 may be formed between the first gate spacers 140. The first gate electrode 125 may be formed on the first gate insulating film 130. The first gate electrode 125 may fill the first gate trench 140t to extend lengthwise in the second direction Y1.

The first gate electrode 125 may include at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof. The first gate electrode 125 may include a conductive metal oxide or a conductive metal oxynitride or may include an oxide of any one of the aforementioned materials.

The first gate electrode 125 may be formed by, for example, a replacement process (or a gate last process), but the present inventive concept is not limited thereto.

The first epitaxial pattern 150 may be formed between the first gate structures 120_1 and 120_2, which are adjacent to each other. The first epitaxial pattern 150 may be formed on the first fin-type pattern 110. The first epitaxial pattern 150 may be formed by epitaxial growth.

The first nanosheets 115_1 and 115_2 may be disposed on both sides of the first epitaxial pattern 150. The first epitaxial pattern 150 may be connected to the first nanosheets 115_1 and 115_2.

The first epitaxial pattern 150 may be included in sources/drains that use the first nanosheets 115_1 and 115_2 as channel regions. For example, since the first nanosheets 115_1 and 115_2 can be used as the channel regions of PMOS transistors, the first epitaxial pattern 150 may be included in the sources/drains of the PMOS transistors.

The first epitaxial pattern 150 may include a compressive stress material. The compressive stress material may be a material having a greater lattice constant than Si, such as, for example, SiGe. The compressive stress material can increase the mobility of carriers in channel regions by applying compressive stress to the first nanosheets 115_1 and 115_2.

The first epitaxial pattern 150 may include a p-type dopant. The first epitaxial pattern 150 may include at least one of, for example, boron (B), In, gallium (Ga), and Al. The first epitaxial pattern 150 may include carbon (C) to prevent p-type impurities from diffusing into channel regions.

FIG. 4 illustrates that the first epitaxial pattern 150 is a single-layer film, but the present inventive concept is not limited thereto.

The first epitaxial pattern 150 may include first and second epitaxial sidewalls 151s and 152s which extend from the first fin-type pattern 110. The first epitaxial sidewall 151s may extend from the first fin sidewall 110a of the first fin-type pattern 110. The second epitaxial sidewall 152s may extend from the second sidewall 110b of the first fin-type pattern 110.

The first epitaxial sidewall 151s may include a first epitaxial lower sidewall 151sl, a first epitaxial connecting sidewall 151sc, and a first epitaxial upper sidewall 151su. The first epitaxial lower sidewall 151sl, the first epitaxial connecting sidewall 151sc, and the first epitaxial upper sidewall 151su may be sequentially located from the first fin sidewall 110a of the first fin-type pattern 110.

The first epitaxial lower sidewall 151sl may extend from the first fin sidewall 110a of the first fin-type pattern 110. The first epitaxial lower sidewall 151sl may be connected to the first fin sidewall 110a of the first fin-type pattern 110. The first epitaxial connecting sidewall 151sc may connect the first epitaxial lower sidewall 151sl and the first epitaxial upper sidewall 151su.

The second epitaxial sidewall 152s may include a second epitaxial lower sidewall 152sl, a second epitaxial connecting sidewall 152sc, and a second epitaxial upper sidewall 152su. The second epitaxial lower sidewall 152sl, the second epitaxial connecting sidewall 152sc, and the second epitaxial upper sidewall 152su may be sequentially located from the second fin sidewall 110b of the first fin-type pattern 110.

The second epitaxial lower sidewall 152sl may extend from the second fin sidewall 110b of the first fin-type pattern 110. The second epitaxial lower sidewall 152sl may be connected to the second fin sidewall 110b of the first fin-type pattern 110. The second epitaxial connecting sidewall 152sc may connect the second epitaxial lower sidewall 152sl and the second epitaxial upper sidewall 152su.

The first epitaxial connecting sidewall 151sc may be directly connected to the first epitaxial lower sidewall 151sl and the first epitaxial upper sidewall 151su. The second epitaxial connecting sidewall 152sc may be directly connected to the second epitaxial lower sidewall 152sl and the second epitaxial upper sidewall 152su.

At locations where the first fin-type pattern 110 and the field insulating film 105 meet, the top surface of the first fin-type pattern 110 may be on a level with the top surface of the field insulating film 105. The first and second epitaxial sidewalls 151s and 152s may not be covered by the field insulating film 105.

The first epitaxial pattern 150 may include a first epitaxial top surface 150ts and a first epitaxial bottom surface 105bs which connect the first and second epitaxial sidewalls 151s and 152s.

The first epitaxial bottom surface 150bs may be disposed between the first and second epitaxial sidewalls 151s and 152s. The first epitaxial bottom surface 150bs may connect the first and second epitaxial sidewalls 151s and 152s. The first epitaxial bottom surface 150bs may be directly connected to the first and second epitaxial lower sidewalls 151sl and 152sl. The first epitaxial bottom surface 150bs may contact the top surface of the first fin-type pattern 110. The first epitaxial bottom surface 150bs may face the top surface of the first fin-type pattern 110. The first epitaxial bottom surface 150bs may be a portion of the first epitaxial pattern 150 that vertically overlaps with the top surface of the first fin-type pattern 110.

The first epitaxial top surface 150ts may be disposed between the first and second epitaxial sidewalls 151s and 152s. The first epitaxial top surface 150ts may connect the first and second epitaxial sidewalls 151s and 152s.

The first epitaxial top surface 150ts may be directly connected to the first and second epitaxial upper sidewalls 151su and 152su.

The first and second epitaxial upper sidewalls 151su and 152su may be inclined surfaces that are inclined with respect to the top surface of the substrate 100. The distance between the first and second epitaxial upper sidewalls 151su and 152su may decrease in a direction extending away from the first fin-type pattern 110 (e.g., the third direction Z1). For example, a distance between the first and second epitaxial upper sidewalls 151su and 152su, which is measured in the second direction Y1, may decrease as the distance from the first fin-type pattern 110 increases in the third direction Z1. For example, the first and second epitaxial upper sidewalls 151su and 152su may be formed of crystal planes included in a first crystal plane group.

The first and second epitaxial lower sidewalls 151sl and 152sl may be inclined surfaces that are inclined with respect to the top surface of the substrate 100. The distance between the first and second epitaxial lower sidewalls 151sl and 152sl may increase in a direction extending away from the first fin-type pattern 110 (e.g., the third direction Z1). For example, a distance between the first and second epitaxial lower sidewalls 151sl and 152sl, which is measured in the second direction Y1, may increase as the distance from the first fin-type pattern 110 increases in the third direction Z1. For example, the first and second epitaxial lower sidewalls 151sl and 152sl may be formed of crystal planes included in a second crystal plane group.

The first and second epitaxial connecting sidewalls 151sc and 152sc may be parallel to the thickness direction of the substrate 100. For example, each of the first and second epitaxial connecting sidewalls 151sc and 152sc may be perpendicular with respect to the top surface of the substrate 100. The distance between the first and second epitaxial connecting sidewalls 151sc and 152sc may decrease in a direction extending away from the first fin-type pattern 110 (e.g., the third direction Z1). For example, a distance between the first and second epitaxial connecting sidewalls 151sc and 152sc, which is measured in the second direction Y1, may be substantially constant as the distance from the first fin-type pattern 110 increases in the third direction Z1.

For example, the first and second epitaxial connecting sidewalls 151sc and 152sc may be formed of crystal planes included in a third crystal plane group. The first epitaxial top surface 150ts may be formed of a crystal plane included in a fourth crystal plane group.

The first and second crystal plane groups may be the same. The first crystal plane group may differ from the third and fourth crystal plane groups.

The first crystal plane group may be a {111} crystal plane group. For example, the first crystal plane group may include one of (1 1 1), (1 1 −1), (1 −1 1), (1 −1 −1), (−1 1 1), (−1 1 −1), (−1 −1 1), and (−1 −1 −1) planes.

The third crystal plane group may be a {110} crystal plane group. For example, the third crystal plane group may include one of (1 1 0), (1 −1 0), (−1 1 0), (−1 −1 0), (1 0 1), (1 0 −1), (−1 0 1), (−1 0 −1), (0 1 1), (0 1 −1), (0 −1 1), and (0 −1 −1) planes.

The fourth crystal plane group may be a {100} crystal plane group. The fourth crystal plane group may include one of (1 0 0), (−1 0 0), (0 1 0), (0 −1 0), (0 0 1), and (0 0 −1) crystal planes. The {100} crystal plane group may include crystal planes parallel to the top surface of the substrate 100.

FIG. 4 illustrates that the top surface of the first fin-type pattern 110 is parallel to the first epitaxial top surface 150ts, but the present inventive concept is not limited thereto.

The interlayer insulating film 190 may be formed on the first epitaxial pattern 150. The interlayer insulating film 190 may surround the first gate spacers 140. The interlayer insulating film 190 may include lower and upper interlayer insulating films 191 and 192. The upper interlayer insulating film 192 may be formed on the top surfaces of the first gate spacers 140 and the top surface of the first gate electrode 125. The lower and upper interlayer insulating films 191 and 192 may include at least one of, for example, silicon oxide, silicon nitride, and silicon oxynitride.

The cross section of the first nanosheet 115_1 taken in the first direction X1 will hereinafter be described with reference to FIGS. 5A through 5D.

Figure 5A:
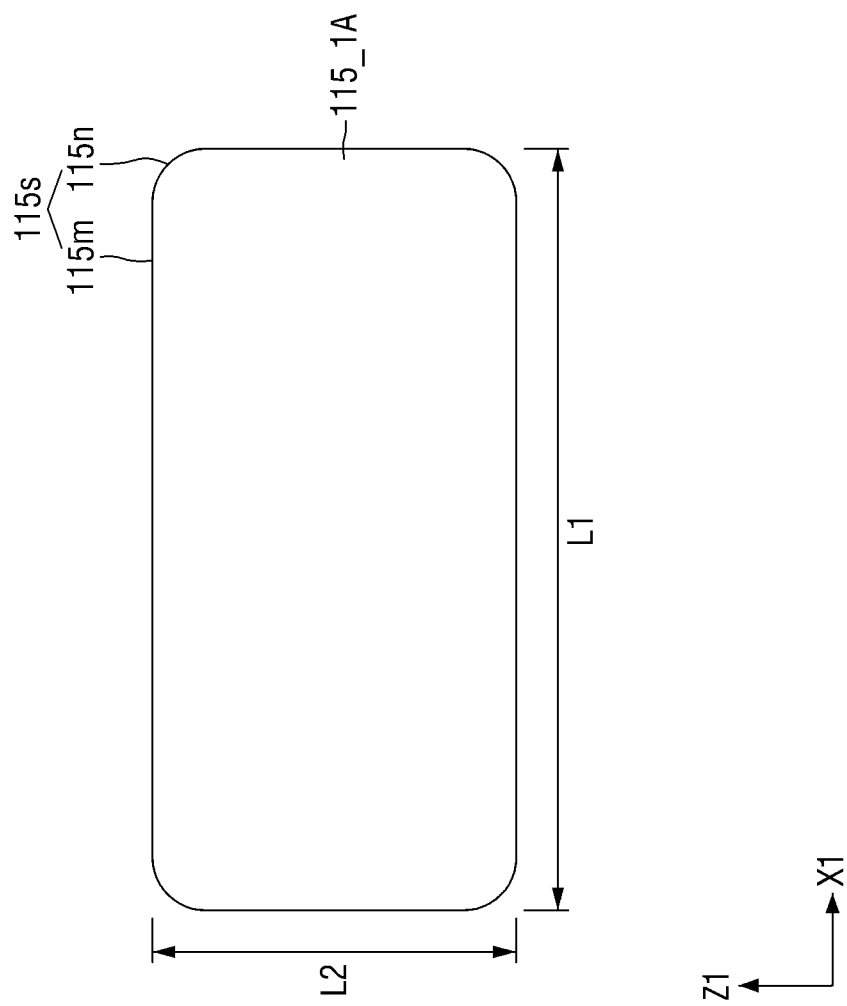

Referring to FIG. 5A, a cross-section 115s of the first nanosheet 115_1A may have a shape formed by the combination of four straight lines 115m and four curved lines 115n. The cross-section 115s of the first nanosheet 115_1A may have, for example, a square shape with rounded corners. A width L1 of the first nanosheet 115_1A and a height L2 of the first nanosheet 115_1A may be different from each other on the cross-section 115s of the first nanosheet 115_1A. In the example of FIG. 5A, the width L1 may be greater than the height L2. For example, the cross-section 115s of the first nanosheet 115_1A may have a rectangular shape with rounded corners, but the present inventive concept is not limited thereto.

Referring to FIG. 5B, the width L1 of the first nanosheet 115_1B and the height L2 of the first nanosheet 115_1B may be the same on the cross-section 115s of the first nanosheet 115_1B. For example, the cross-section 115s of the first nanosheet 115_1B may have a square shape with rounded corners, but the present inventive concept is not limited thereto.

Referring to FIG. 5C, a length L11 of one side of the first nanosheet 115_1C and a length L11 of the other side of the first nanosheet 115_1C may be different from each other on the cross-section 115s of the first nanosheet 115_1C. For example, the cross-section 115s of the first nanosheet 115_1C may have a trapezoidal shape with rounded corners, but the present inventive concept is not limited thereto.

Referring to FIG. 5D, unlike in the example of FIG. 5A, the cross-section 115s of the first nanosheet 115_1D may have the shape of a figure consisting entirely of the curved lines 115*n*. For example, the first nanosheet 115_1D may have a shape of a circle.

In some embodiments, unlike what is illustrated in FIGS. 5A through 5D, the cross-section 115*s* of the first nanosheet 115_1 may be a shape formed by a combination of the straight lines 115*m* (e.g., a polygon shape). For example, the cross-section 115*s* of the first nanosheet 115_1 may a shape formed by four linear segments that intersect one another (e.g., a square shape with non-rounded corners). As another example, the cross-section 115*s* of the first nanosheet 115_1 may be a shape formed by three linear segments that intersect one another (e.g., a triangle).

The longitudinal section of the first nanosheets 115_1 taken in the first direction X1 will hereinafter be described with reference to FIGS. 6A through 6C.

Referring to FIG. 6A, the thickness of the first nanosheet 115_1E is substantially constant in a direction extending away from the first epitaxial pattern 150 and the first gate spacers 140 of the first gate structure 120_1 (e.g., in the first direction X1). For example, a thickness $t1\_a$ of an end portion of the first nanosheet 115_1E adjacent to the first epitaxial pattern 150 may be substantially the same as a thickness $t1\_b$ of a middle portion of the first nanosheet 115_1E. Thickness may refer to the thickness or height measured in a direction perpendicular to a top surface of the substrate 100 (e.g., the third direction Z1).

Referring to FIG. 6B, the thickness of the first nanosheet 115_1F may decrease in directions extending away from the first epitaxial pattern 150 and the first gate spacers 140 of the first gate structure 120_1. For example, the thicknesses $t1\_a$ of the opposite end portions of the first nanosheet 115_1F adjacent to the first epitaxial pattern 150 may be greater than the thickness $t1\_b$ of the middle portion of the first nanosheet 115_1F. In some embodiments, the upper surface of the first nanosheet 115_1F may have a concave shape with respect to a top surface of the substrate 100, and the lower surface of first nanosheet 115_1F may have a convex shape with respect to the top surface of the substrate 100.

Referring to FIG. 6C, the thickness of the first nanosheet 115_1G may increase in directions extending away from the first epitaxial pattern 150 and the first gate spacers 140 of the first gate structure 120_1. For example, the thicknesses $t1\_a$ of the opposite end portions of the first nanosheet 115_1G adjacent to the first epitaxial pattern 150 may be smaller than the thickness $t1\_b$ of the middle portion of the first nanosheet 115_1G. In some embodiments, the upper surface of the first nanosheet 115_1G may have a convex shape with respect to a top surface of the substrate 100, and the lower surface of first nanosheet 115_1G may have a concave shape with respect to the top surface of the substrate 100.

Referring to FIGS. 6B and 6C, the thickness of the first nanosheet 115_1 may continuously change away from the first epitaxial pattern 150 and the first gate spacers 140 of the first gate structure 120_1.

The longitudinal section of the example first nanosheet 115_1H taken in the first direction X1 will hereinafter be described with reference to FIG. 7.

Figure 7:
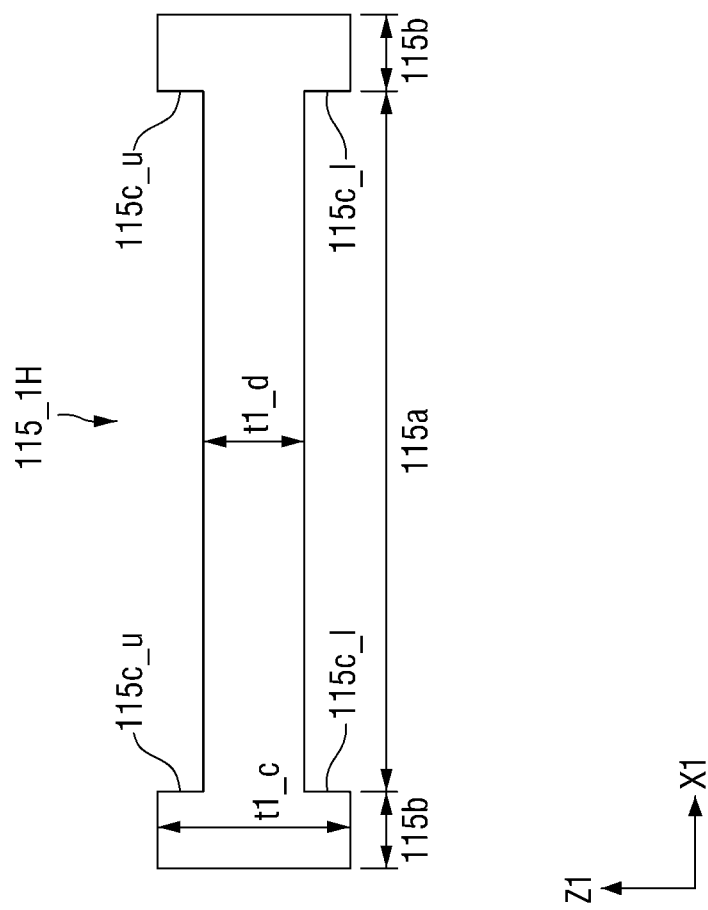
FIG. 7 is a cross-sectional view, taken along line A-A, of an example of the first nanosheet of FIG. 1.

Referring to FIG. 7, the first nanosheet 115_1H may be a trimmed sheet pattern. The first nanosheet 115_1H may include a first portion 115*a* and second portions 115*b*. The second portions 115*b* of the first nanosheet 115_1H may be disposed on both sides of the first portion 115*a* of the first nanosheet 115_1H. The second portions 115*b* of the first nanosheet 115_1H may overlap with the first gate spacers 140 of the first gate structure 120_1, and the first portion 115*a* of the first nanosheet 115_1H may be a portion of the first nanosheet 115_1H that overlaps with the first gate insulating film 130 and the first gate electrode 125 of the first gate structure 120_1.

Thicknesses $t1\_c$ of the second portions 115*b* of the first nanosheet 115_1H may be greater than a thickness $t1\_d$ of the first portion 115*a* of the first nanosheet 115_1H. The change from the thicknesses $t1\_c$ to the thickness $t1\_d$ (and vice versa) may be abrupt, such that inner vertical sidewalls 115*c* u 115*c*_1 may be formed in the first nanosheet 115_1H. The inner vertical sidewalls may include upper inner vertical sidewalls 115*c* u and lower inner vertical sidewalls 115*c*_1 of the second portions 115*b*. The upper inner vertical sidewalls 115*c* u may connect planar upper surfaces of the second portions 115*b* to a planar upper surface of the first portion 115*a*, and the lower inner vertical sidewalls 115*c*_1 may connect planar lower surfaces of the second portions 115*b* to a planar lower surface of the first portion 115*a*.

Alternatively to what is illustrated in FIG. 7, in some embodiments, corners of the first nanosheet 115_1H where the first portion 115*a* and the second portions 115*b* of the first nanosheet 115_1H are connected may be rounded. FIG. 7 illustrates that the width of the first portion 115*a* of the first nanosheet 115_1H is uniform, but the present inventive concept is not limited thereto. For example, the width of the first portion 115*a* of the first nanosheet 115_1H may vary as illustrated in FIG. 6B or 6C.

Figure 8:
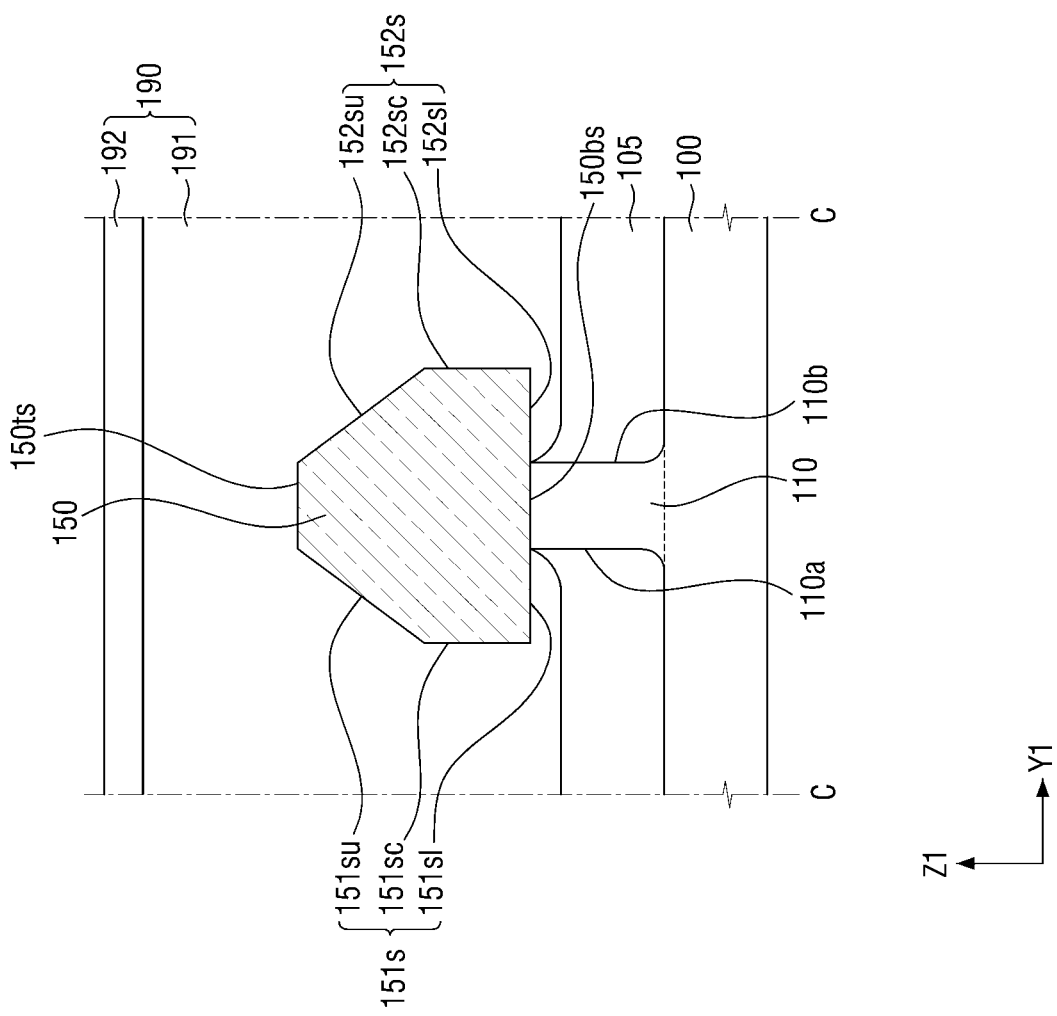
FIG. 8 is a cross-sectional view illustrating a semiconductor device according to some embodiments of the present inventive concept.
Figure 9:
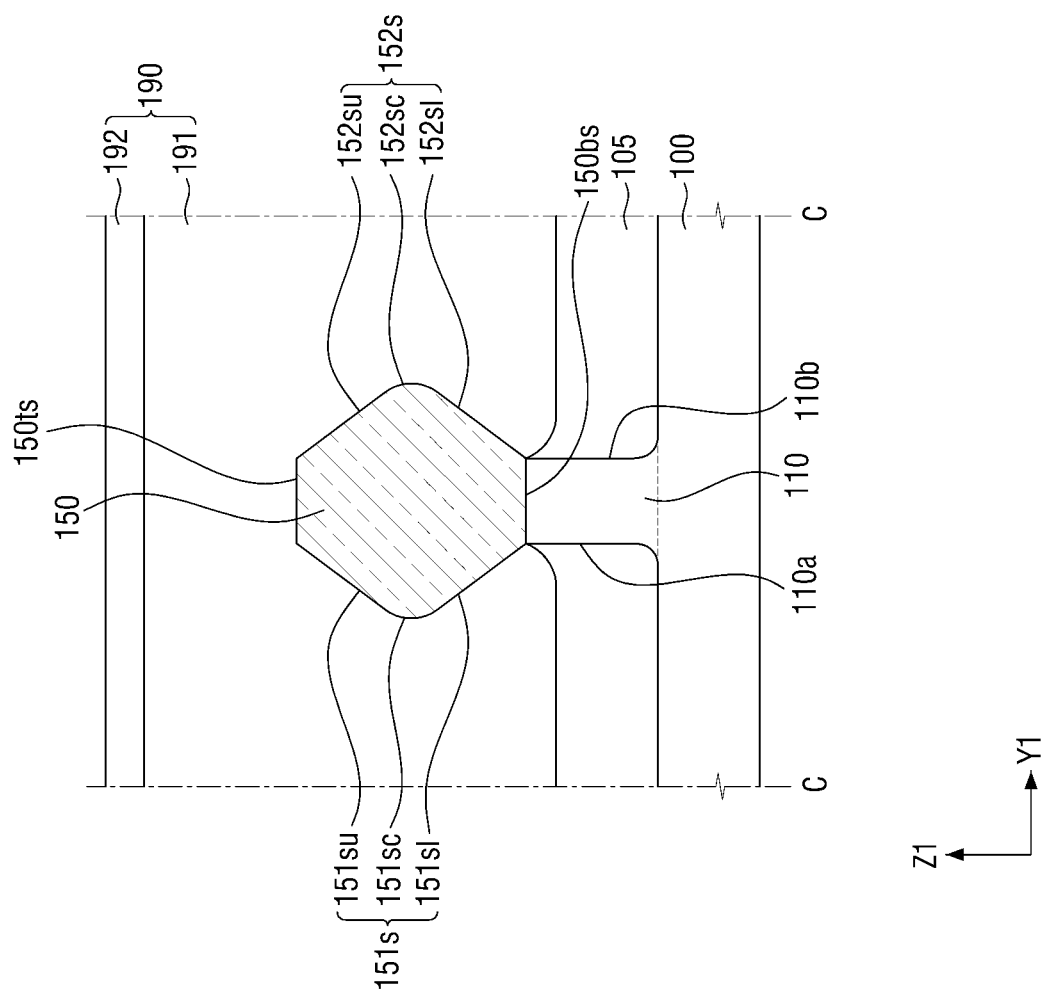
FIG. 9 is a cross-sectional view illustrating a semiconductor device according to some embodiments of the present inventive concept.

FIG. 8 is a cross-sectional view illustrating a semiconductor device according to some example embodiments of the present inventive concept. FIG. 9 is a cross-sectional view illustrating a semiconductor device according to some example embodiments of the present inventive concept. For convenience, the semiconductor devices of FIGS. 8 and 9 will hereinafter be described, focusing mainly on the differences with the semiconductor device of FIGS. 1 through 7.

Referring to FIG. 8, first and second epitaxial upper sidewalls 151*su* and 152*su* may be formed of crystal planes from a different crystal plane group from first and second epitaxial lower sidewalls 151*sl* and 152*sl*. The first and second epitaxial lower sidewalls 151*sl* and 152*sl* may be parallel to the top surface of a substrate 100.

For example, the first and second epitaxial upper sidewalls 151*su* and 152*su* may be formed of crystal planes included in a first crystal plane group, the first and second epitaxial lower sidewalls 151*sl* and 152*sl* may be formed of crystal planes included in a second crystal plane group, and the first and second crystal plane groups may be different.

For example, the first crystal plane group may be a {111} crystal plane group, and the second crystal plane group may be a {100} crystal plane group.

Referring to FIG. 9, first and second epitaxial connecting sidewalls 151*sc* and 152*sc* may not be facets where crystal planes appear.

For example, the first and second epitaxial connecting sidewalls 151*sc* and 152*sc* may be curved surfaces. A first epitaxial upper sidewall 151*su* and a first epitaxial lower sidewall 151*sl* may be connected by the first epitaxial connecting sidewall 151*sc*, which is a curved surface. A second epitaxial upper sidewall 152*su* and a second epitaxial lower sidewall 152*sl* may be connected by the second epitaxial connecting sidewall 152*sc*, which is a curved surface.

Figure 11:
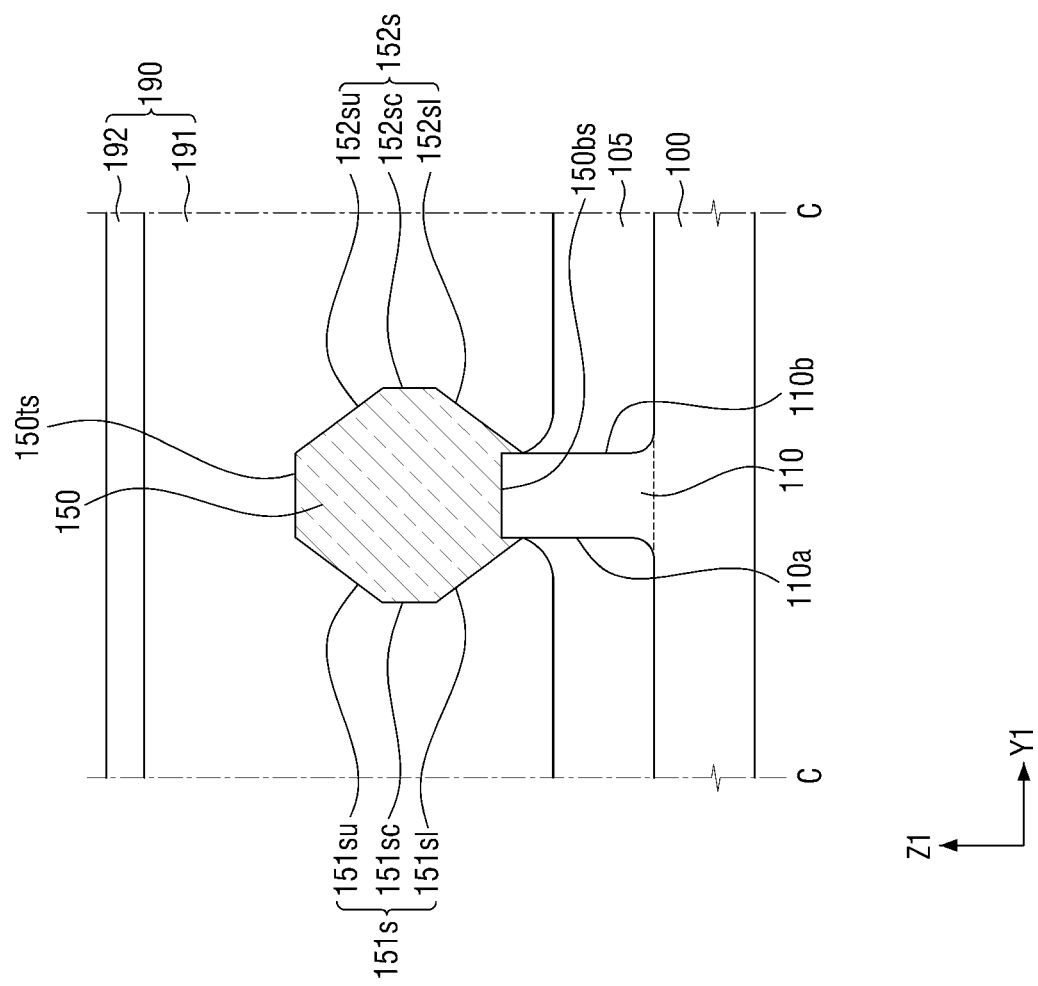
FIG. 11 is a cross-sectional view illustrating a semiconductor device according to some embodiments of the present inventive concept.
Figure 12:
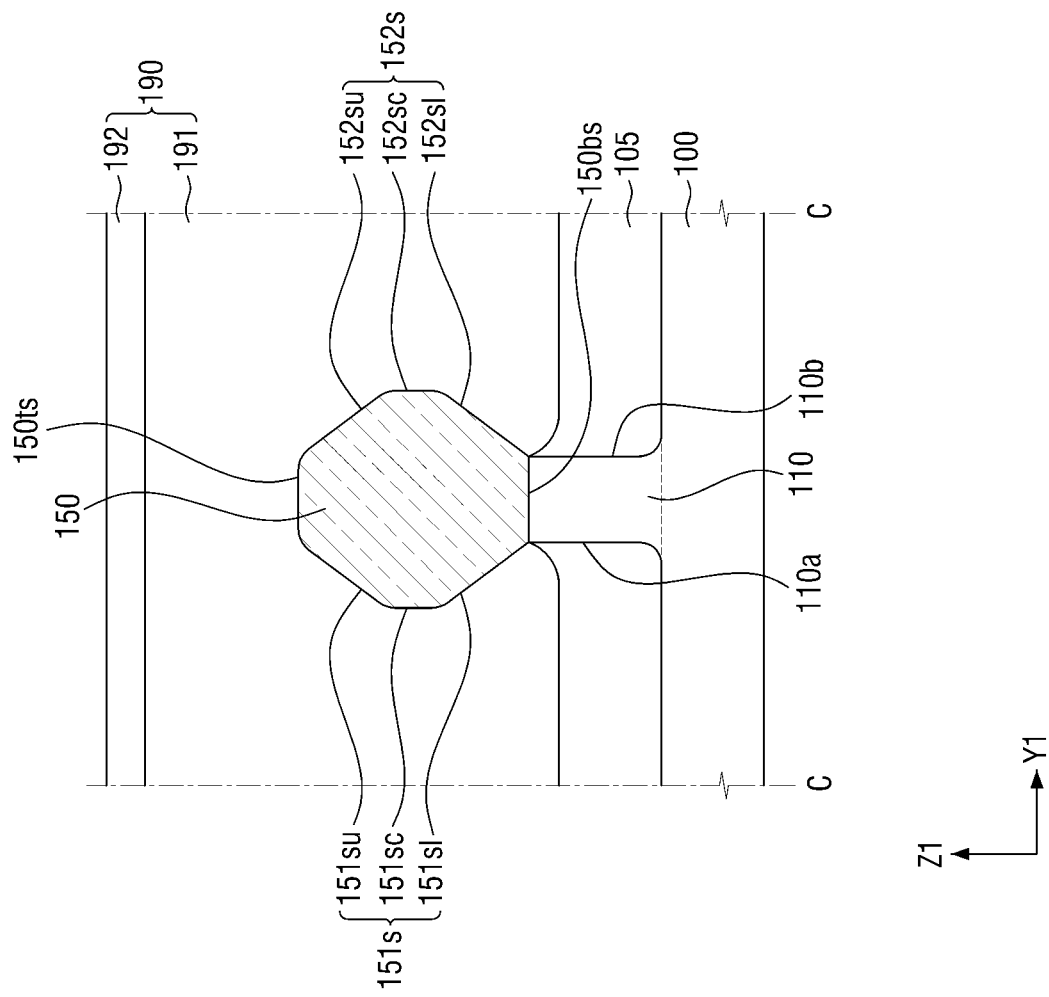
FIG. 12 is a cross-sectional view illustrating a semiconductor device according to some embodiments of the present inventive concept.

FIGS. 10A through 10D are cross-sectional views illustrating semiconductor devices according to some example embodiments of the present inventive concept. FIG. 11 is a cross-sectional view illustrating a semiconductor device according to some example embodiments of the present inventive concept. FIG. 12 is a cross-sectional view illustrating a semiconductor device according to some example embodiments of the present inventive concept. For convenience, the semiconductor devices of FIGS. 10A through 10D, 11, and 12 will hereinafter be described, focusing mainly on the differences with the semiconductor device of FIGS. 1 through 7.

Referring to FIGS. 10A through 10D, first and second epitaxial sidewalls 151s and 152s may be partially covered by a field insulating film 105.

A first epitaxial lower sidewall 151sl may include first and second portions 151s/1 and 151s/2. The second portion 151s/2 may be a portion of the first epitaxial lower sidewall 151sl that extends from a first fin sidewall 110a of a first fin-type pattern 110. In some embodiments, the second portion 151s/2 may be perpendicular to the top surface of the substrate 100. The first portion 151s/1 may be disposed between the second portion 151s/2 and a first epitaxial connecting sidewall 151sc. The second portion 151s/2 may be a portion of the first epitaxial lower sidewall 151sl that is covered by the field insulating film 105. For example, the field insulating film 105 may contact the second portion 151s/2 of the first epitaxial lower sidewall 151sl. The first portion 151s/1 may be a portion of the first epitaxial lower sidewall 151sl that extends beyond the top surface of the field insulating film 105.

A second epitaxial lower sidewall 152sl may include first and second portions 152s/1 and 152s/2. The second portion 152s/2 may be a portion of the second epitaxial lower sidewall 152sl that extends from a second fin sidewall 110b of the first fin-type pattern 110. In some embodiments, the second portion 152s/2 may be perpendicular to the top surface of the substrate 100. The first portion 152s/1 may be disposed between the second portion 152s/2 and a second epitaxial connecting sidewall 152sc. The second portion 152s/2 may be a portion of the second epitaxial lower sidewall 152sl that is covered by the field insulating film 105. For example, the field insulating film 105 may contact the second portion 152s/2 of the second epitaxial lower sidewall 152sl. The first portion 152s/1 may be a portion of the second epitaxial lower sidewall 152sl that extends beyond the top surface of the field insulating film 105.

Figure 10A:
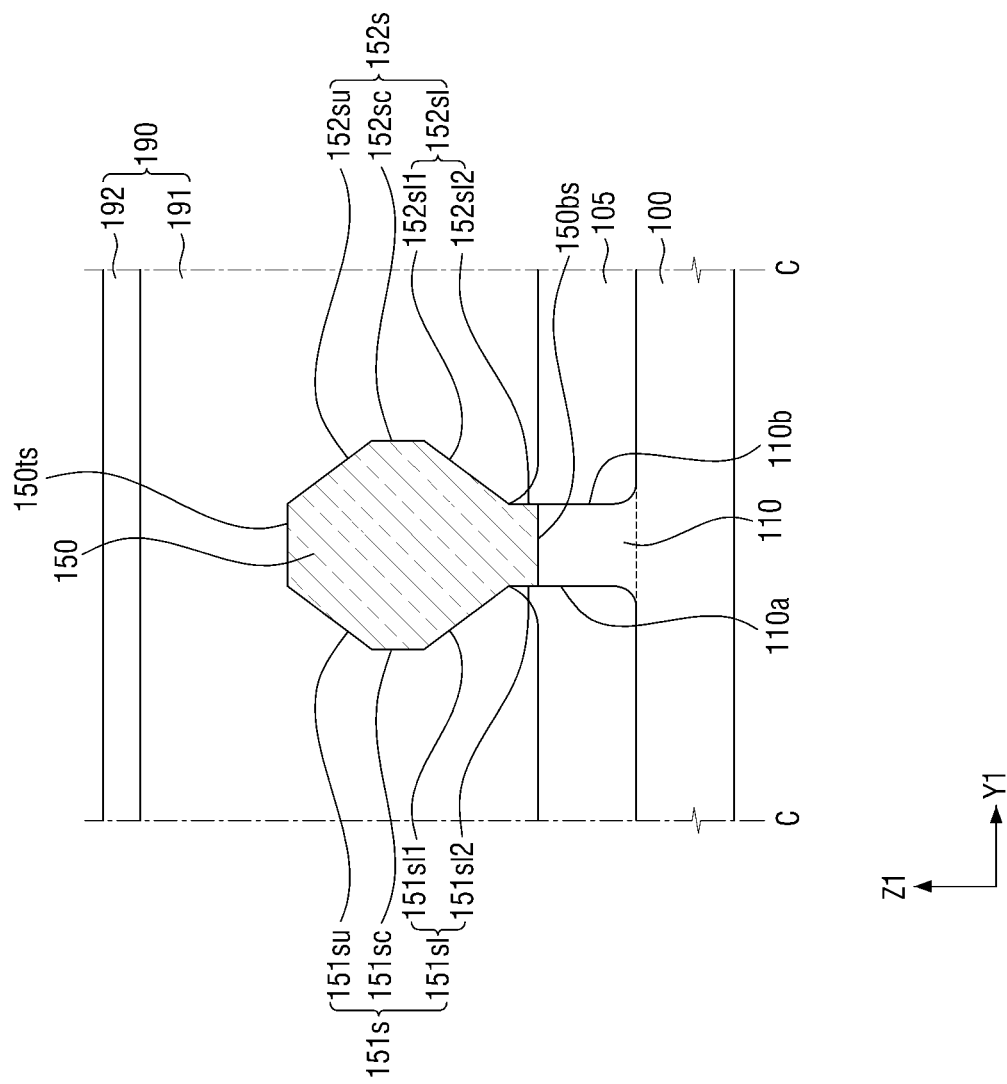
FIGS. 10A, 10B, 10C, and 10D are cross-sectional views illustrating semiconductor devices according to some embodiments of the present inventive concept.

Referring to FIG. 10A, the first portion 151s/1 of the first epitaxial lower sidewall 151sl and the first portion 152s/1 of the second epitaxial lower sidewall 152sl may be inclined surfaces that are inclined with respect to the top surface of the substrate 100. For example, the first portion 151s/1 of the first epitaxial lower sidewall 151sl and the first portion 152s/1 of the second epitaxial lower sidewall 152sl may be formed of crystal planes included in a {111} crystal plane group. The crystal plane group that forms the first portion 151s/1 of the first epitaxial lower sidewall 151sl and the first portion 152s/1 of the second epitaxial lower sidewall 152sl may be the same as the crystal plane group that forms first and second epitaxial upper sidewalls 151su and 152su.

Figure 10B:
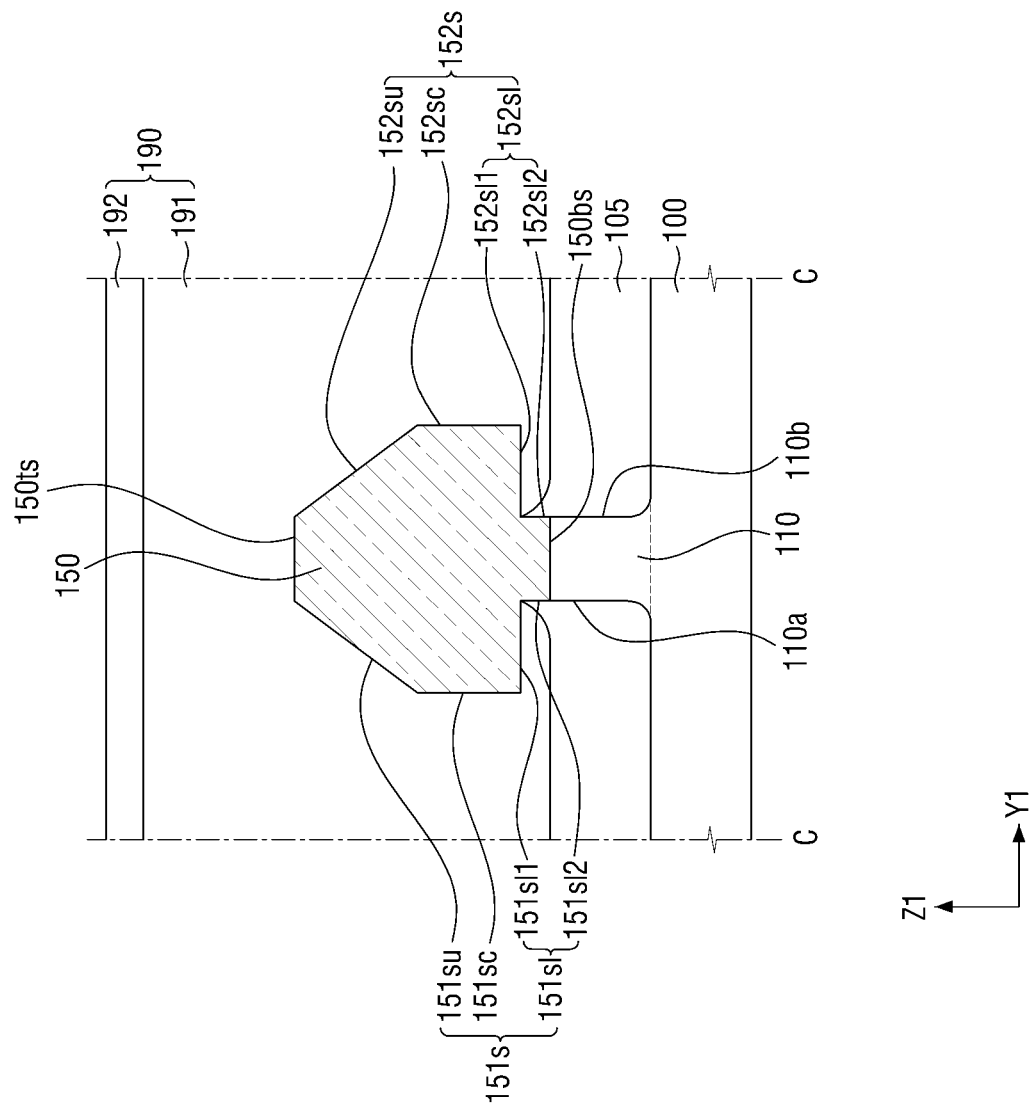
Figure 10C:
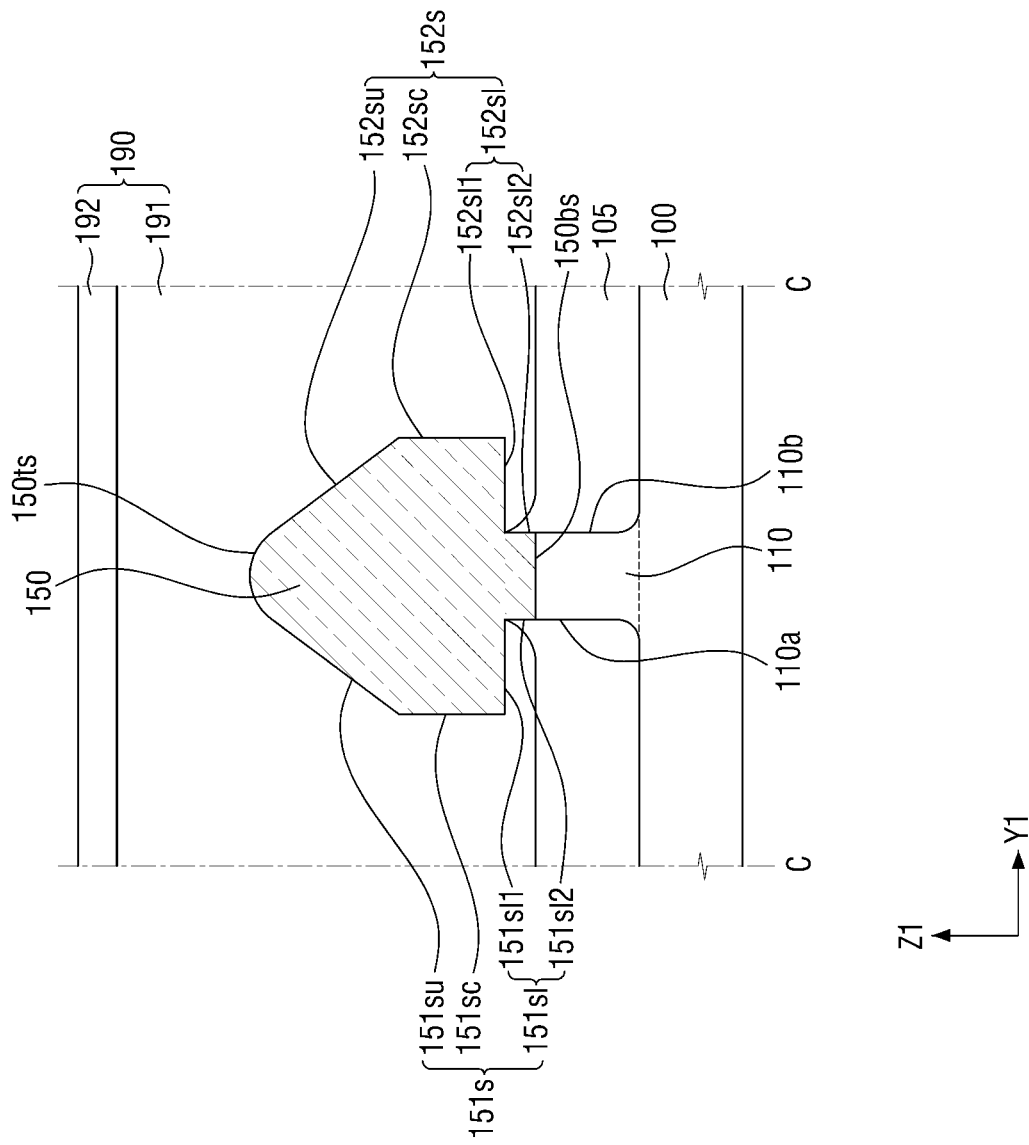
Figure 10D:
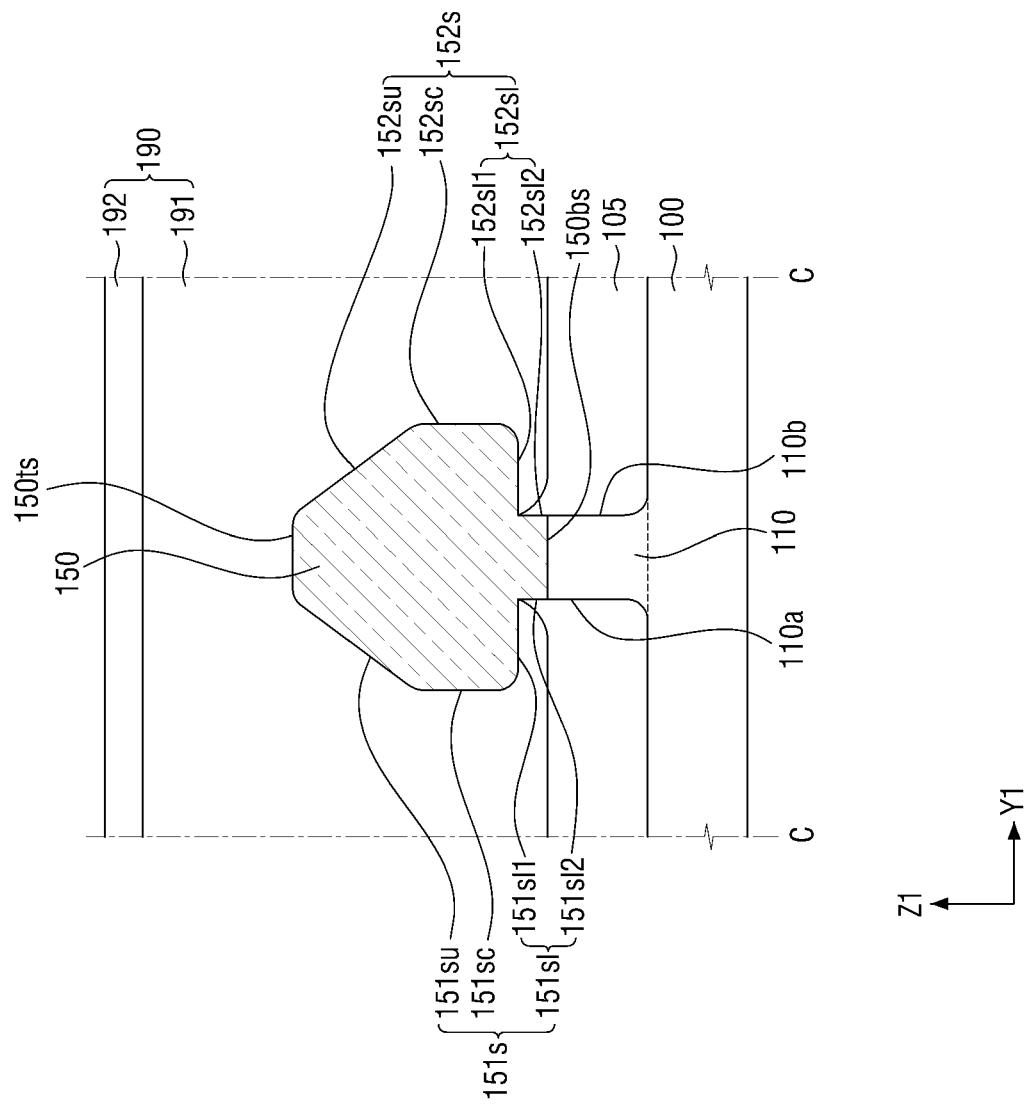

Referring to FIGS. 10B through 10D, the first portion 151s/1 of the first epitaxial lower sidewall 151sl and the first portion 152s/1 of the second epitaxial lower sidewall 152sl may be parallel to the top surface of the substrate 100. The first and second epitaxial lower sidewalls 151sl and 152sl may include portions that are parallel to the top surface of the substrate 100. For example, the first portion 151s/1 of the first epitaxial lower sidewall 151sl and the first portion 152s/1 of the second epitaxial lower sidewall 152sl may be formed of crystal planes included in a {100} crystal plane group. The crystal plane group that forms the first portion 151s/1 of the first epitaxial lower sidewall 151sl and the first portion 152s/1 of the second epitaxial lower sidewall 152sl may be different from the crystal plane group that forms the first and second epitaxial upper sidewalls 151su and 152su.

Referring to FIG. 10C, the first epitaxial top surface 150ts may be rounded. Referring to FIG. 10D, corners where the first epitaxial top surface 150ts and the first epitaxial upper sidewall 151su meet and corners where the first epitaxial top surface 150ts and the second epitaxial upper sidewall 152su meet may be rounded. In addition, corners where the first epitaxial upper sidewall 151su and the first epitaxial connecting sidewall 151sc meet and corners where the first epitaxial connecting sidewall 151sc and the first portion 151s/1 of the first epitaxial lower sidewall 151sl meet may be rounded. Further, corners where the second epitaxial upper sidewall 152su and the second epitaxial connecting sidewall 152sc meet and corners where the second epitaxial connecting sidewall 152sc and the first portion 152s/1 of the second epitaxial lower sidewall 152sl meet may be rounded.

Referring to FIG. 11, portions of first and second fin sidewalls 110a and 110b of a first fin-type pattern 110 may protrude beyond the top surface of a field insulating film 105. For example, an upper surface of the first fin-type pattern 110 may be at a higher vertical level (e.g., in the third direction Z1) than the top surface of the field insulating film 105.

The field insulating film 105 may not cover portions of the first and second fin sidewalls 110a and 110b of the first fin-type pattern 110. A first epitaxial pattern 150 may cover the portions of the first and second fin sidewalls 110a and 110b of the first fin-type pattern 110 that are not covered by the field insulating film 105.

A first epitaxial sidewall 151s may extend upwardly from a location where the first fin sidewall 110a of the first fin-type pattern 110 and the field insulating film 105 meet. A second epitaxial sidewall 152s may extend upwardly from a location where the second fin sidewall 110b of the first fin-type pattern 110 and the field insulating film 105 meet.

Referring to FIG. 12, corners where a first epitaxial connecting sidewall 151sc and a first epitaxial lower sidewall 151sl meet and where the first epitaxial connecting sidewall 151sc and a first epitaxial upper sidewall 151su meet may be rounded.

Also, corners where a second epitaxial connecting sidewall 152sc and a second epitaxial lower sidewall 152sl meet and where the second epitaxial connecting sidewall 152sc and a second epitaxial upper sidewall 152su meet may be rounded.

Also, corners where a first epitaxial top surface 150ts and the first epitaxial upper sidewall 151su meet and where the first epitaxial top surface 150ts and the second epitaxial upper sidewall 152su meet may be rounded.

Figure 13:
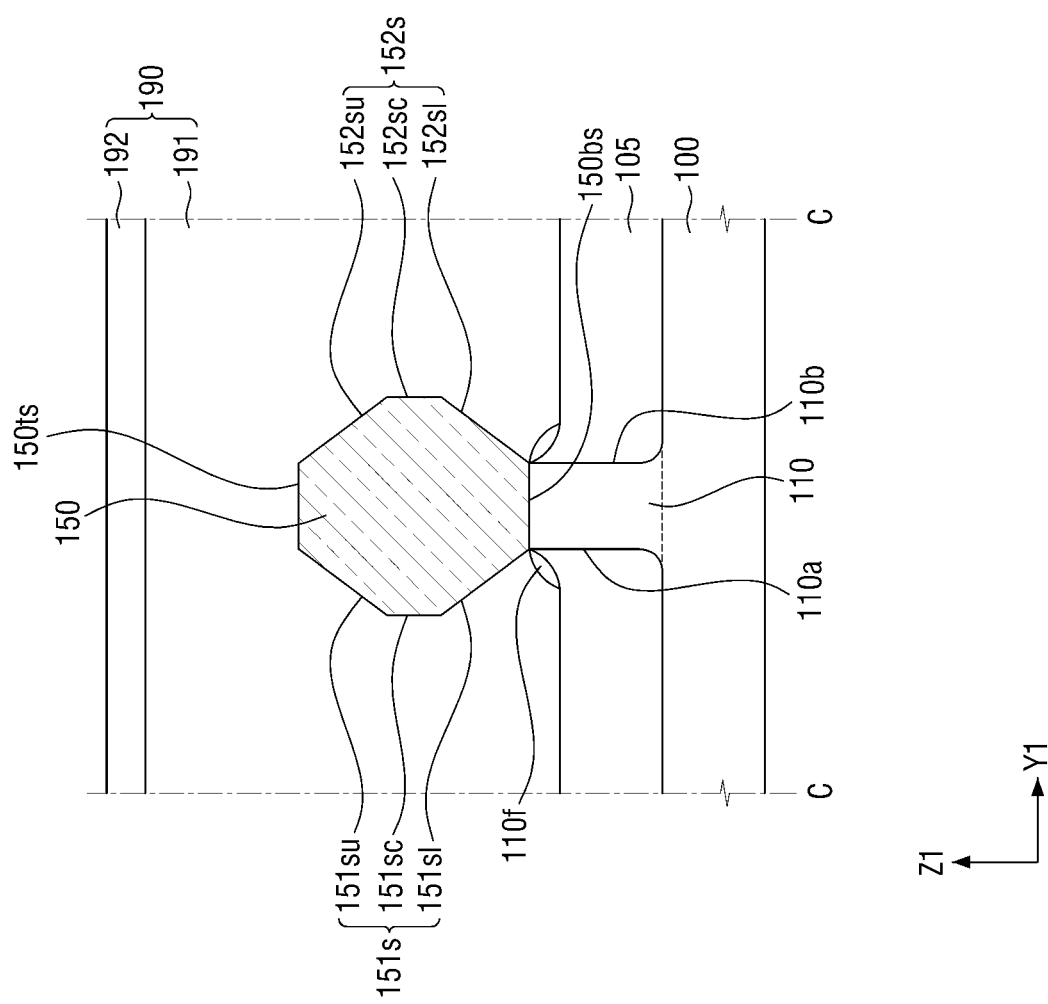
FIG. 13 is a cross-sectional view illustrating a semiconductor device according to some embodiments of the present inventive concept.

FIG. 13 is a cross-sectional view illustrating a semiconductor device according to some example embodiments of the present inventive concept. For convenience, the semiconductor device of FIG. 13 will hereinafter be described, focusing mainly on the differences with the semiconductor device of FIGS. 1 through 7.

Referring to FIG. 13, the semiconductor device may further include first epitaxial spacers 110f which are disposed at first and second fin sidewalls 110a and 110b of a first fin-type pattern 110.

The height of the top surfaces of the first epitaxial spacers 110f may be lower than, or the same as, the height of a location where the first fin sidewall 110a of the first fin-type pattern 110 and a field insulating film 105 meet. The height of the top surfaces of the first epitaxial spacers 110f may be lower than, or the same as, the height of a location where the second fin sidewall 110b of the first fin-type pattern 110 and a field insulating film 105 meet. For example, the height of the top surfaces of the first epitaxial spacers 110f may be lower than, or the same as, the height of the upper surface of the first fin-type pattern 110.

The first epitaxial spacers 110f may be disposed on the field insulating film 105. The first epitaxial spacers 110f may include at least one of, for example, SiN, SiON, $SiO_2$, SiOCN, and a combination thereof.

Figure 14:
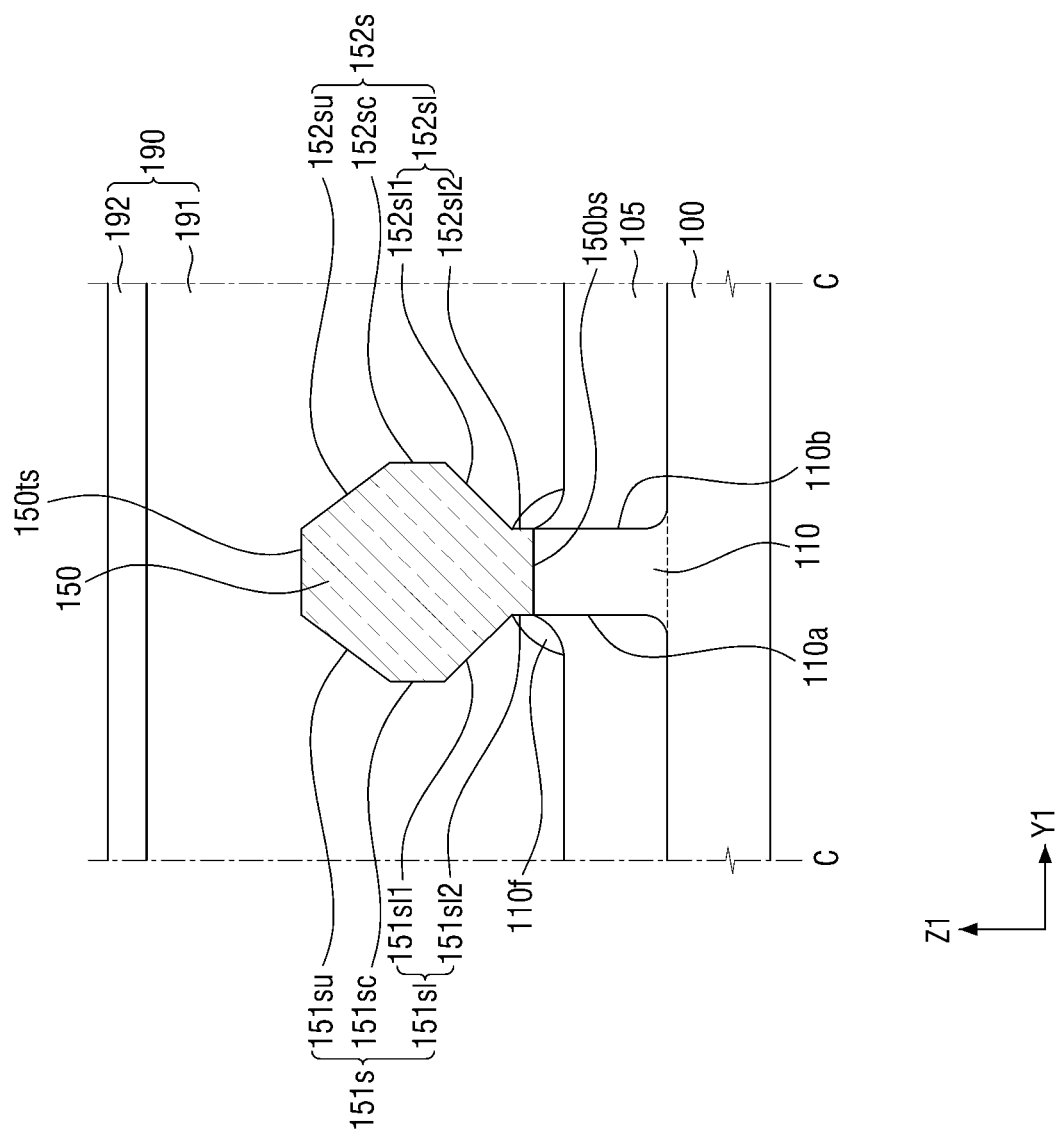
FIG. 14 is a cross-sectional view illustrating a semiconductor device according to some embodiments of the present inventive concept.

FIG. 14 is a cross-sectional view illustrating a semiconductor device according to some example embodiments of the present inventive concept. For convenience, the semiconductor device of FIG. 14 will hereinafter be described, focusing mainly on the differences with the semiconductor device of FIG. 13.

Referring to FIG. 14, first and second epitaxial sidewalls 151s and 152s may be partially covered by first epitaxial spacers 110f.

The height of the top surfaces of the first epitaxial spacers 110f may be greater than the height of a location where a first fin sidewall 110a of a first fin-type pattern 110 and a field insulating film 105 meet. The height of the top surfaces of the first epitaxial spacers 110f may be greater than the height of a location where a second fin sidewall 110b of the first fin-type pattern 110 and the field insulating film 105 meet. For example, the height of the top surfaces of the first epitaxial spacers 110f may be greater than the height of the upper surface of the first fin-type pattern 110.

The first epitaxial lower sidewall 151sl may include first and second portions 151sl1 and 151sl2. The second portion 151sl2 of the first epitaxial lower sidewall 151sl may be a portion of the first epitaxial lower sidewall 151sl that extends from the first fin sidewall 110a of the first fin-type pattern 110. The first portion 151sl1 of the first epitaxial lower sidewall 151sl may be disposed between the second portion 151sl2 of the first epitaxial lower sidewall 151sl and a first epitaxial connecting sidewall 151sc. The second portion 151sl2 of the first epitaxial lower sidewall 151sl may be a portion of the first epitaxial lower sidewall 151sl that is covered by a first one of the first epitaxial spacers 110f. In some embodiments, the first one of the first epitaxial spacer 110f may contact the second portion 151sl2 of the first epitaxial lower sidewall 151sl. The first portion 151sl1 of the first epitaxial lower sidewall 151sl may be a portion of the first epitaxial lower sidewall 151sl that extends beyond the top surfaces of the first epitaxial spacers 110f.

The second epitaxial lower sidewall 152sl may include first and second portions 152sl1 and 152sl2. The second portion 152sl2 of the second epitaxial lower sidewall 152sl may be a portion of the second epitaxial lower sidewall 152sl that extends from the second fin sidewall 110b of the first fin-type pattern 110. The first portion 152sl1 of the second epitaxial lower sidewall 152sl may be disposed between the second portion 152sl2 of the second epitaxial lower sidewall 152sl and a second epitaxial connecting sidewall 152sc. The second portion 152sl2 of the second epitaxial lower sidewall 152sl may be a portion of the second epitaxial lower sidewall 152sl that is covered by a second one of the first epitaxial spacers 110f. In some embodiments, the second one of the first epitaxial spacer 110f may contact the second portion 152sl2 of the second epitaxial lower sidewall 152sl. The first portion 152sl1 of the second epitaxial lower sidewall 152sl may be a portion of the second epitaxial lower sidewall 152sl that extends beyond the top surfaces of the first epitaxial spacers 110f.

For example, the first portion 151sl1 of the first epitaxial lower sidewall 151sl and the first portion 152sl1 of the second epitaxial lower sidewall 152sl may be formed of crystal planes included in a {111} crystal plane group. The crystal plane group that forms the first portion 151sl1 of the first epitaxial lower sidewall 151sl and the first portion 152sl1 of the second epitaxial lower sidewall 152sl may be the same as the crystal plane group that forms first and second epitaxial upper sidewalls 151su and 152su.

In another example, the first portion 151sl1 of the first epitaxial lower sidewall 151sl and the first portion 152sl1 of the second epitaxial lower sidewall 152sl may be formed of crystal planes included in a {100} crystal plane group. The crystal plane group that forms the first portion 151sl1 of the first epitaxial lower sidewall 151sl and the first portion 152sl1 of the second epitaxial lower sidewall 152sl may be different from the crystal plane group that forms the first and second epitaxial upper sidewalls 151su and 152su.

First epitaxial patterns 150 having different shapes, from among the first epitaxial patterns 150 of FIGS. 1 through 14, may be disposed in different parts of a substrate 100.

Figure 15:
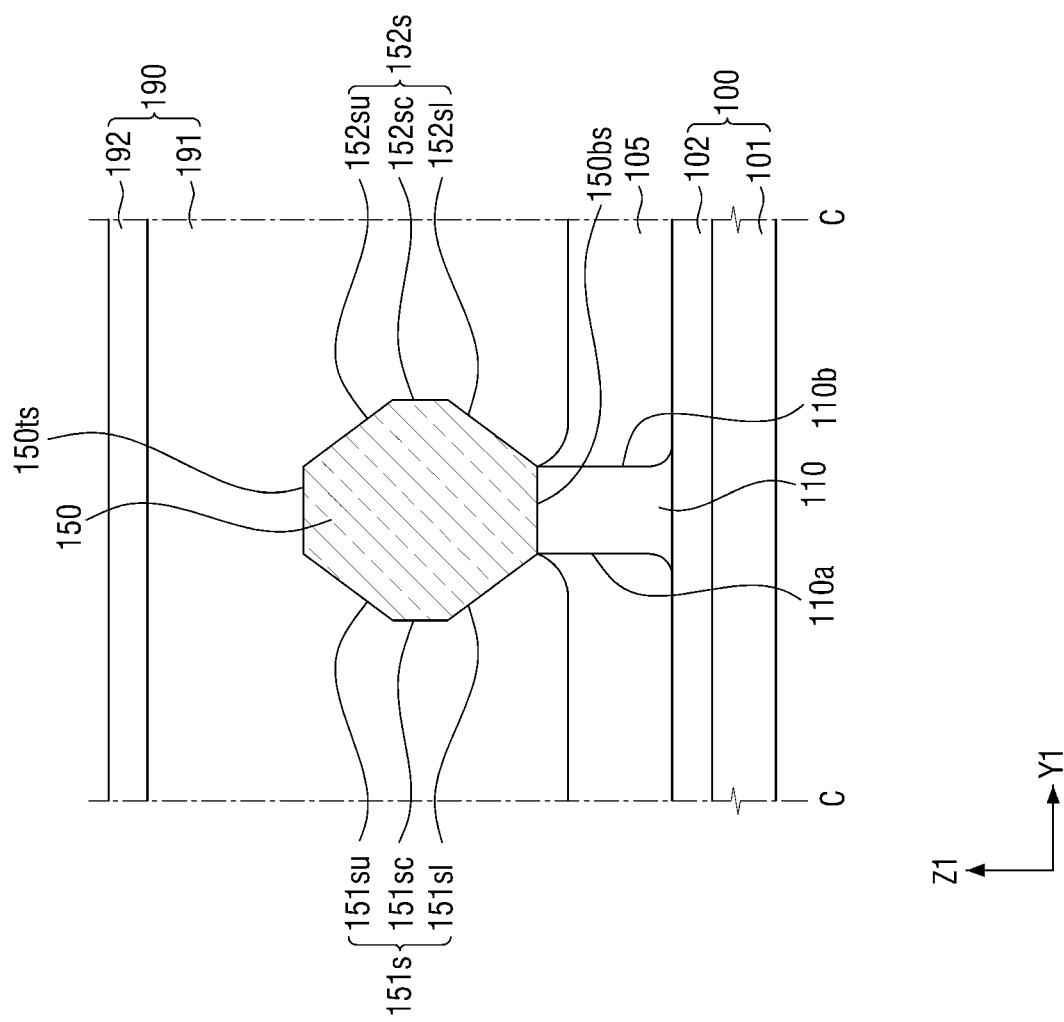
FIG. 15 is a cross-sectional view illustrating a semiconductor device according to some embodiments of the present inventive concept.
Figure 16:
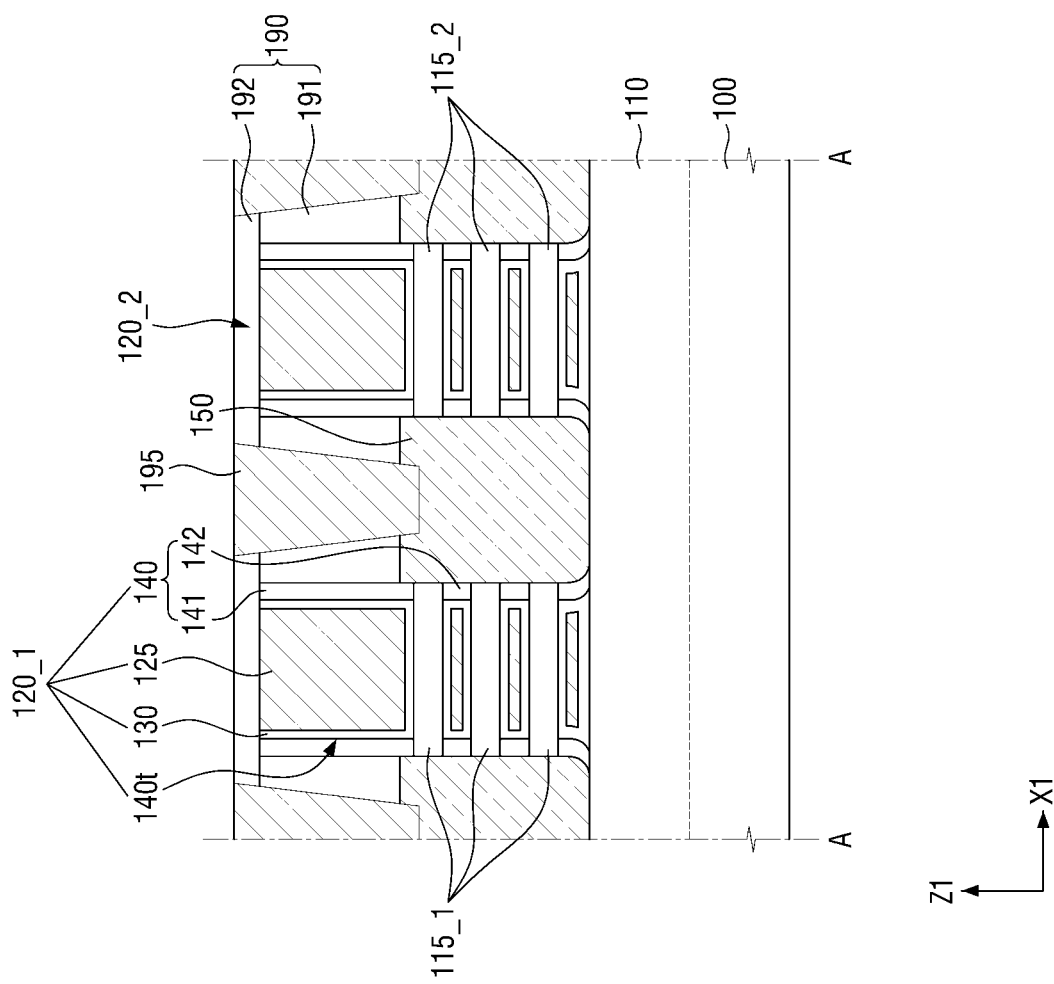
FIGS. 16 and 17 are cross-sectional views illustrating a semiconductor device according to some embodiments of the present inventive concept.
Figure 17:
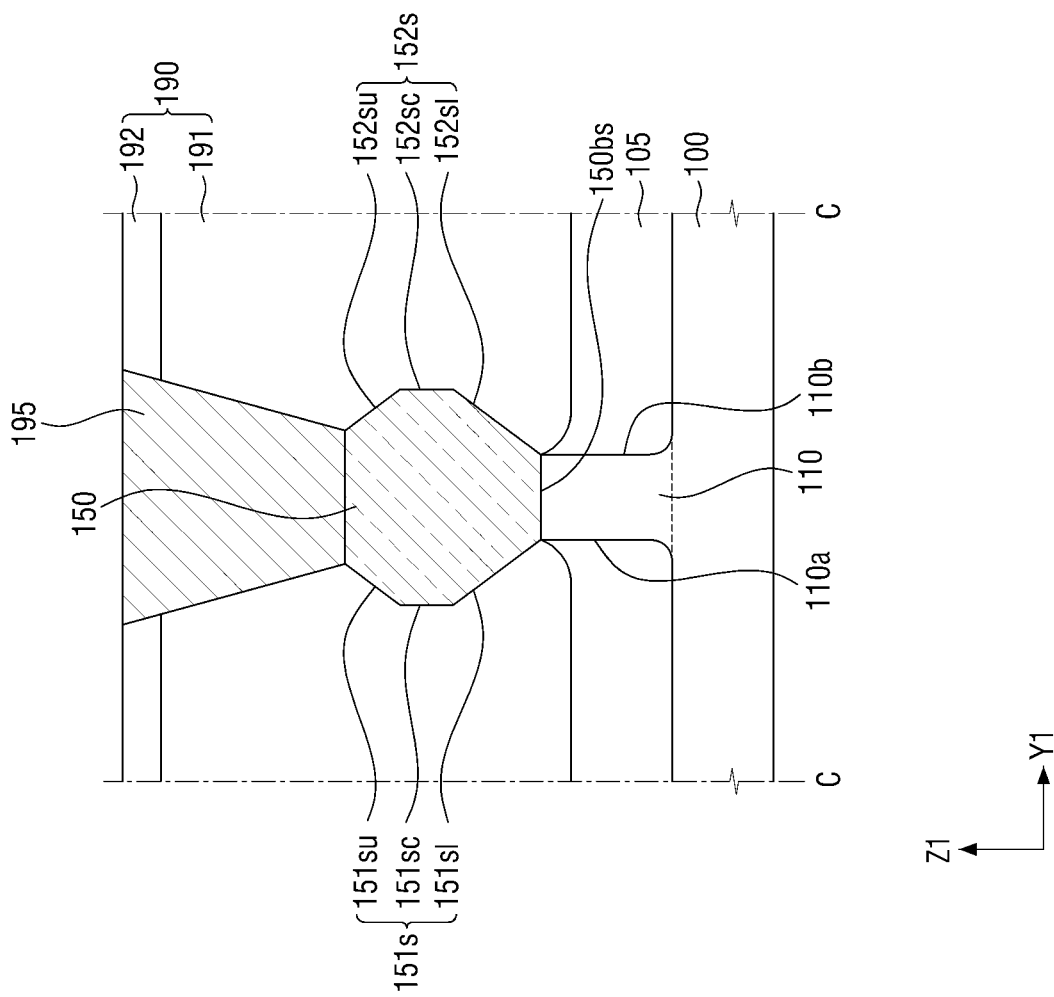
Figure 18:
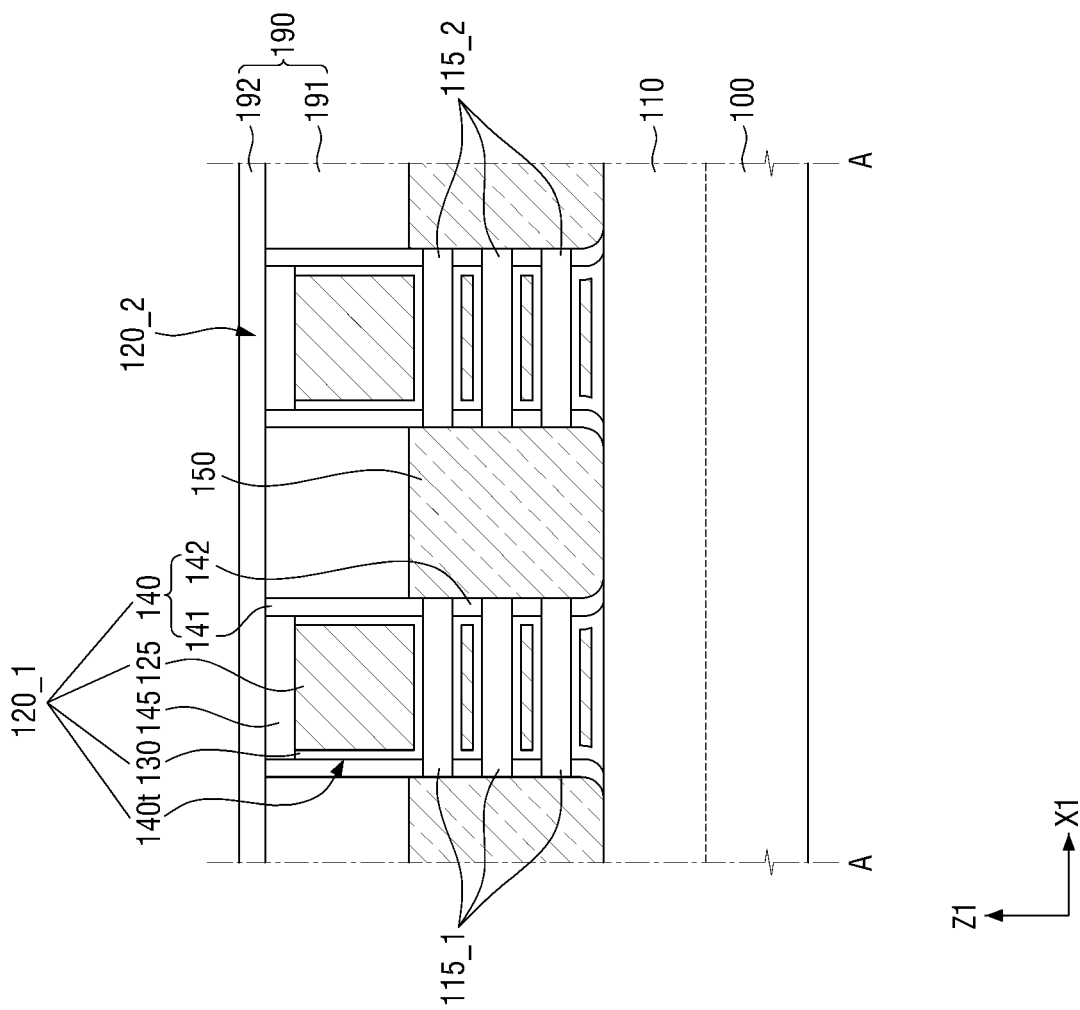
FIG. 18 is a cross-sectional view illustrating a semiconductor device according to some embodiments of the present inventive concept.

FIG. 15 is a cross-sectional view illustrating a semiconductor device according to some example embodiments of the present inventive concept. FIGS. 16 and 17 are cross-sectional views illustrating a semiconductor device according to some example embodiments of the present inventive concept. FIG. 18 is a cross-sectional view illustrating a semiconductor device according to some example embodiments of the present inventive concept. For convenience, the semiconductor devices of FIGS. 15 through 18 will hereinafter be described, focusing mainly on the differences with the semiconductor device of FIGS. 1 through 7.

Referring to FIG. 15, a first fin-type pattern 110 may be disposed on a buried insulating film 102. The first fin-type pattern 110 may be disposed on an insulating pattern which is included in the buried insulating film 102.

For example, a substrate 100 may include a base substrate 101 and the buried insulating film 102, which is disposed on the base substrate 101. The base substrate 101 may include a semiconductor material. The buried insulating film 102 may include at least one of, for example, SiN, SiON, and $SiO_2$.

For example, the substrate 100 may be an SOI substrate or an SGOI substrate, but the present inventive concept is not limited thereto.

Referring to FIGS. 16 and 17, the semiconductor device may further include a contact 195 which is connected to a first epitaxial pattern 150.

The contact 195 may penetrate an upper interlayer insulating film 192 and may be formed in a lower interlayer insulating film 191. The contact 195 may be formed on the first epitaxial pattern 150. During the formation of the contact 195, part of the first epitaxial pattern 150 may be etched. The contact 195 may be inserted in the etched part of the first epitaxial pattern 150. An upper surface of the contact 195 may be coplanar with an upper surface of the upper interlayer insulating film 192. Terms such as "same," "equal," "constant," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The contact 195 may include at least one of, for example, Ta, TaN, Ti, TiN, WN, tungsten carbonitride (WCN), W, Co, Ru, Mo, Ni, Al, Cu, and doped polysilicon. Alternatively to what is illustrated in FIGS. 16 and 17, a silicide film may be formed between the contact 195 and the first epitaxial pattern 150.

Referring to FIG. 18, each of the first gate structures 120_1 and 120_2 may include a first gate electrode 125, a first gate insulating film 130, first gate spacers 140, and a first gate trench 140t and may further include a capping pattern 145.

The first gate electrode 125 may fill part of the first gate trench 140t. The capping pattern 145 may be formed on the first gate electrode 125. The capping pattern 145 may fill the rest of the first gate trench 140t that is not filled with the first gate electrode 125.

FIG. 18 illustrates the first gate insulating film 130 is not formed between the first gate spacers 140 and the capping pattern 145, but the present inventive concept is not limited thereto.

FIG. 18 illustrates the capping pattern 145 is formed between the first gate spacers 140, but the present inventive concept is not limited thereto. In some embodiments, not only the top surface of the first gate electrode 125, but also the top surfaces of the first gate spacers 140, may be recessed below the top surface of a lower interlayer insulating film 191. In this case, the capping pattern 145 may be formed on the top surfaces of the first gate spacers 140 and the top surface of the first gate electrode 125.

The top surface of the capping pattern 145 may be on the same plane as the top surface of the lower interlayer insulating film 191. For example, the top surface of the capping pattern 145 may be coplanar with upper surfaces of the first outer spacers 141 and the top surface of the lower interlayer insulating film 191. The capping pattern 145 may include a material having etching selectivity with respect to the lower interlayer insulating film 191. The capping pattern 145 may include at least one of, for example, SiN, SiON, SiO$_2$, SiCN, SiOCN, and a combination thereof.

Figure 19:
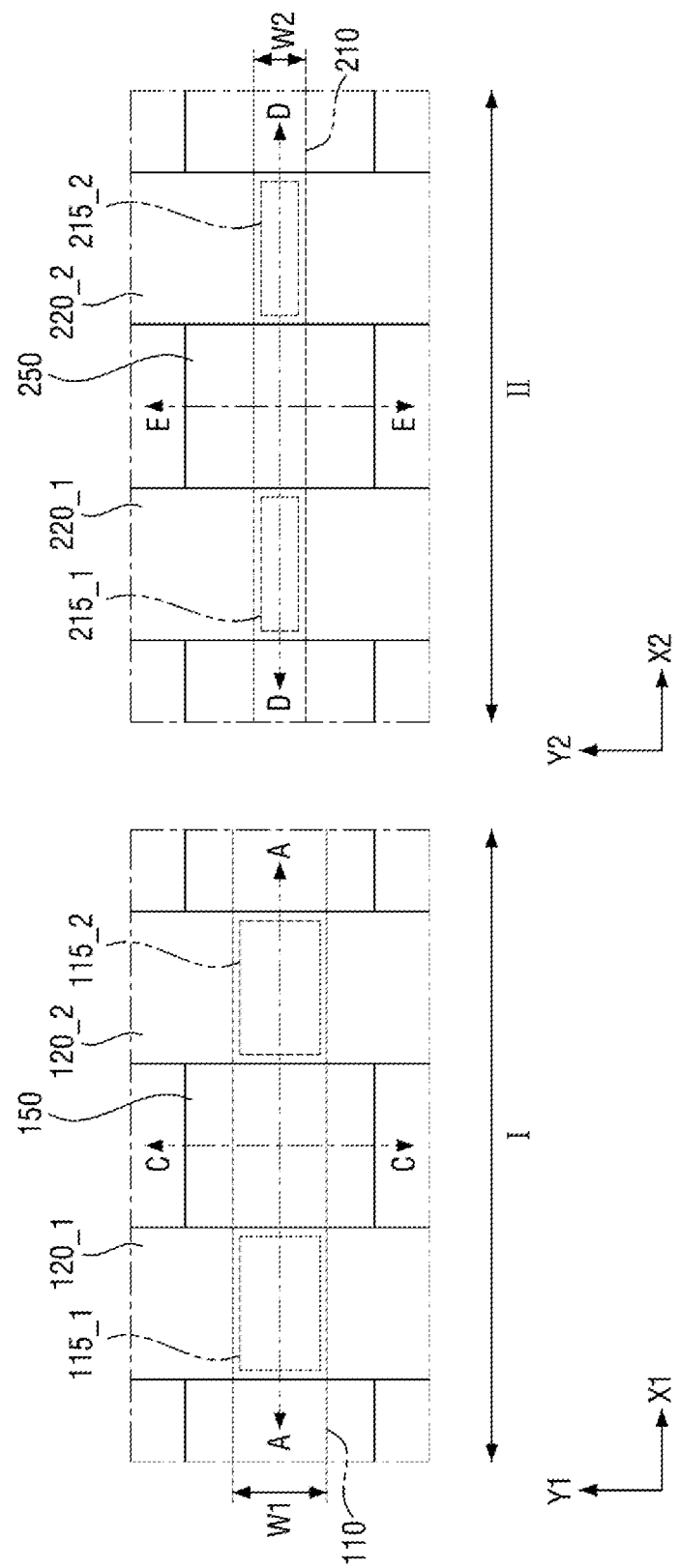
FIG. 19 is a cross-sectional view illustrating a semiconductor device according to some embodiments of the present inventive concept.
Figure 20:
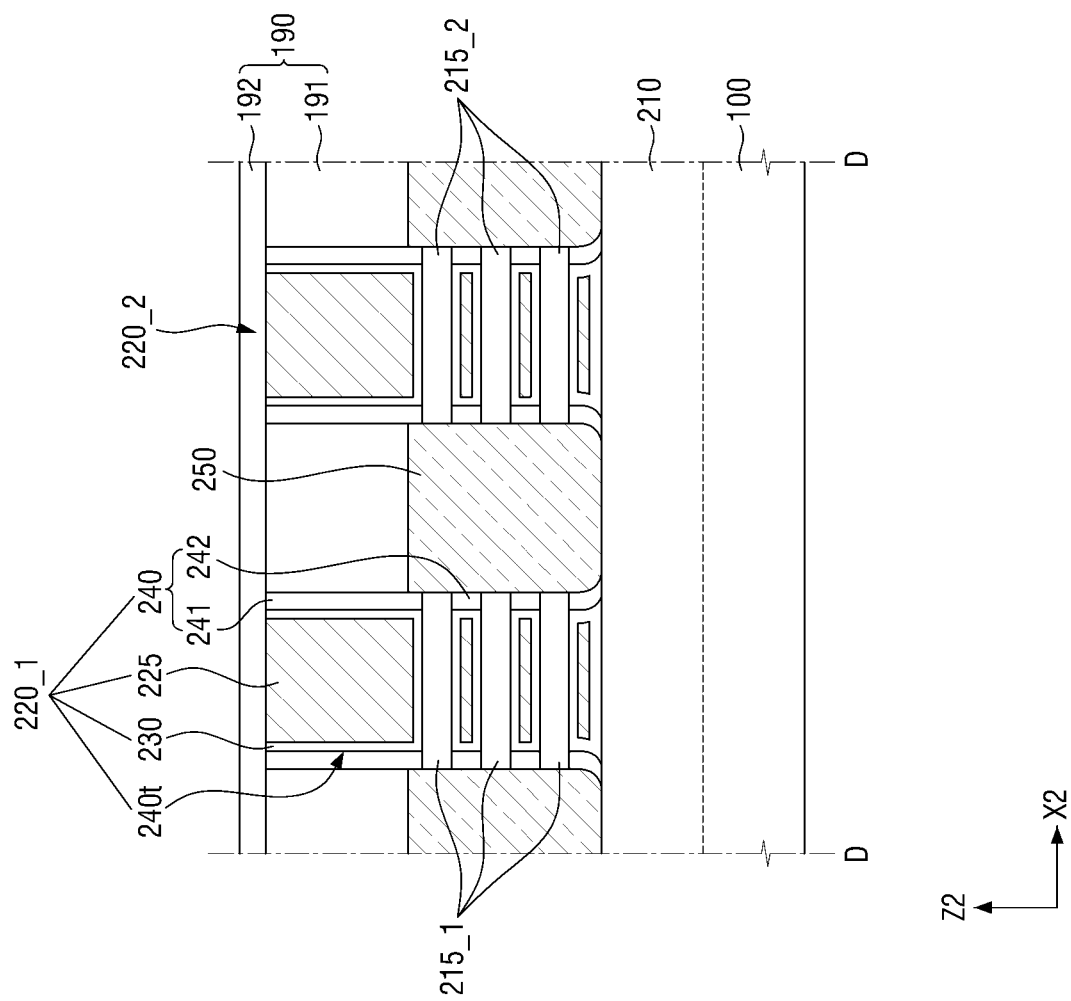
FIG. 20 is a cross-sectional view taken along line D-D of FIG. 19.
Figure 21:
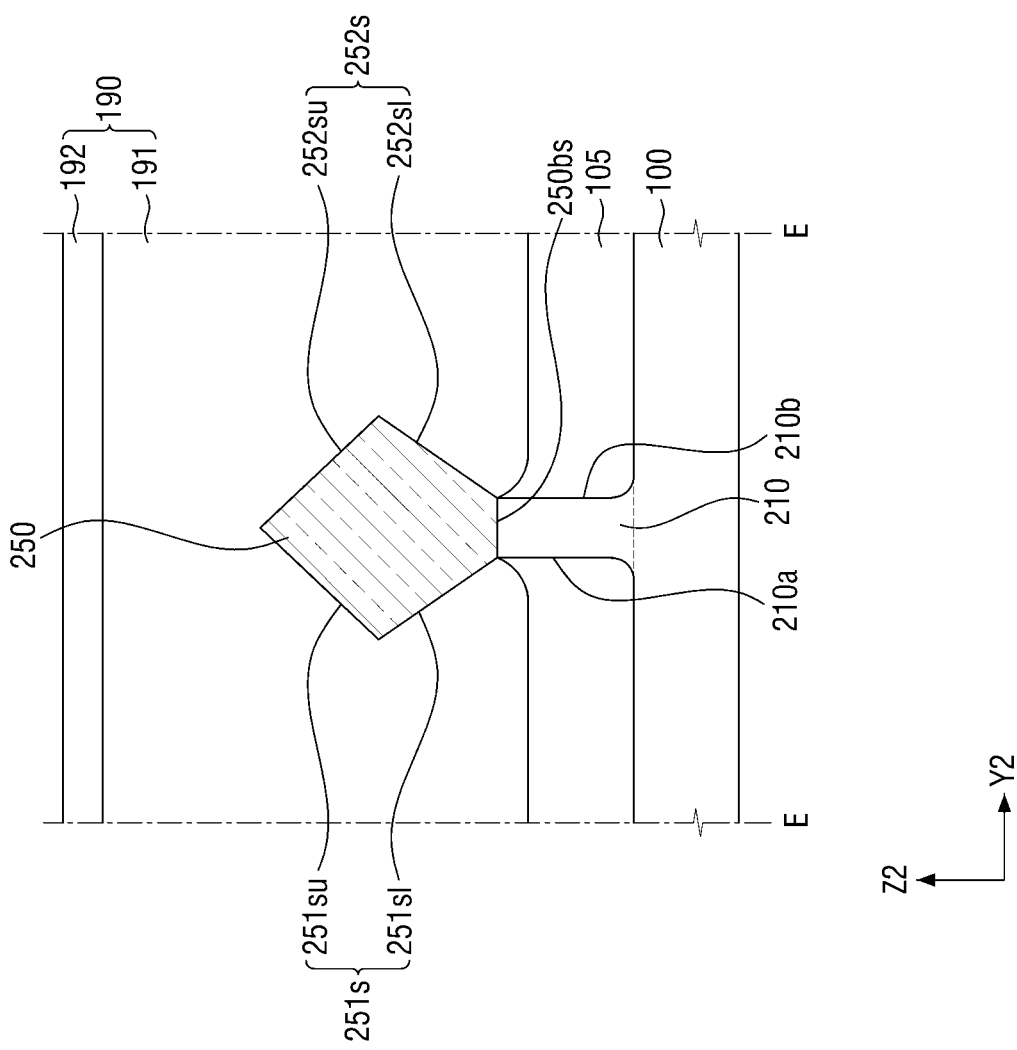
FIG. 21 is a cross-sectional view taken along line E-E of FIG. 19.

FIG. 19 is a cross-sectional view illustrating a semiconductor device according to some example embodiments of the present inventive concept. FIG. 20 is a cross-sectional view taken along line D-D of FIG. 19. FIG. 21 is a cross-sectional view taken along line E-E of FIG. 19.

A first fin-type pattern 110, first gate structures 120_1 and 120_2, first nanosheets 115_1 and 115_2, and a first epitaxial pattern 150, which are formed in a first region I of FIG. 19, are substantially the same as their respective counterparts of any one of FIGS. 1 through 14, except for a width W1 of the first fin-type pattern 110. Thus, the semiconductor device of FIG. 19 will hereinafter be described, focusing mainly on a second region II thereof.

A cross-sectional view taken along line A-A of FIG. 19 may be substantially as illustrated in FIG. 2, and a cross-sectional view taken along line C-C of FIG. 19 may be substantially as illustrated in any one of FIGS. 4 and 8 through 14.

Referring to FIGS. 19 through 21, the semiconductor device may include the first fin-type pattern 110, a second fin-type pattern 210, the first nanosheets 115_1 and 115_2, second nanosheets 215_1 and 215_2, the first gate structures 120_1 and 120_2, second gate structures 220_1 and 220_2, the first epitaxial pattern 150, and a second epitaxial pattern 250.

A substrate 100 may include the first and second regions I and II. The first region I may be a logic region or an input/output (I/O) region. The second region II may be a static random access memory (SRAM) region.

The first fin-type pattern 110, the first nanosheets 115_1 and 115_2, the first gate structures 120_1 and 120_2, and the first epitaxial pattern 150 may be disposed in the first region I. The second fin-type pattern 210, the second nanosheets 215_1 and 215_2, the second gate structures 220_1 and 220_2, and the second epitaxial pattern 250 may be disposed in the second region II.

The first nanosheets 115_1 and 115_2 and the second nanosheets 215_1 and 215_2 may be used as the channel regions of PMOS transistors.

The second fin-type pattern 210 may protrude from the substrate 100 (e.g., in a sixth direction Z2, which is perpendicular to a fourth direction X2 and a fifth direction Y2). The second fin-type pattern 210 may extend lengthwise in a fourth direction X2.

The second fin-type pattern 210 may include first and second fin sidewalls 210a and 210b which face each other. The first and second fin sidewalls 210a and 210b may extend lengthwise in the fourth direction X2. The first and second fin sidewalls 210a and 210b may define the long sides of the second fin-type pattern 210. In some embodiments, the first direction X1, the second direction Y1, and the third direction Z1 may be the same directions as the fourth direction X2, the fifth direction Y2, and the sixth direction Z2, respectively. In other embodiments, the first direction X1, the second direction Y1, and the third direction Z1 may be different from the fourth direction X2, the fifth direction Y2, and the sixth direction Z2, respectively.

The second fin-type pattern 210 may be formed by etching part of the substrate 100 or may include an epitaxial layer grown from the substrate 100. The second fin-type pattern 210 may include an element semiconductor material such as Si or Ge. The second fin-type pattern 210 may include a compound semiconductor such as, for example, a group IV-IV compound semiconductor or a group III-V compound semiconductor.

A field insulating film 105 may at least partially surround the first and second fin sidewalls 210a and 210b. For example, the field insulating film 105 may generally cover the first and second fin sidewalls 210a and 210b. For example, the field insulating film 105 may contact the first and second fin sidewalls 210a and 210b.

The second nanosheets 215_1 and 215_2 may be disposed on the second fin-type pattern 210. Each of the second nanosheets 215_1 and 215_2 may include a plurality of nanosheet layers which are sequentially arranged in the thickness direction of the substrate 100. The plurality of nanosheet layers may be sequentially arranged on the second fin-type pattern 210. For example, the plurality of nanosheet layers of the second nanosheets 215_1 and the plurality of nanosheet layers of the second nanosheets 215_2 may be stacked on the second fin-type pattern 210 in the sixth direction Z2.

The second nanosheets 215_1 and 215_2, which are spaced apart from each other, may be arranged in the fourth direction X2 along the top surface of the second fin-type pattern 210. The second epitaxial pattern 250 may be disposed between the second nanosheets 215_1 and 215_2, which are spaced apart from each other in the fourth direction X2. The second epitaxial pattern 250 may contact side surfaces of each of the second nanosheets 215_1 and 215_2.

The second fin-type pattern 210 and the second nanosheets 215_1 and 215_2 may be formed by selectively removing part of a fin structure including the second fin-type pattern 210 and the second nanosheets 215_1 and 215_2. Thus, the width of the second nanosheets 215_1 and 215_2 in the fifth direction Y2 may be the same as, or smaller than, a width W2 of the second fin-type pattern 210 in the fifth direction Y2.

The width W1 of the first fin-type pattern 110 in a second direction Y1 may be greater than the width W2 of the second fin-type pattern 210. Also, the width of the first nanosheets 115_1 and 115_2 in the second direction Y1 may be greater than the width of the second nanosheets 215_1 and 215_2 in the fifth direction Y2. For example, a first direction X1 may intersect the second direction Y1, and the fourth direction X2 may intersect the fifth direction Y2.

The second nanosheets 215_1 and 215_2 may include an element semiconductor material such as Si or Ge. Also, the second nanosheets 215_1 and 215_2 may include a compound semiconductor such as, for example, a group IV-IV compound semiconductor or a group III-V compound semiconductor.

The second gate structures 220_1 and 220_2 may extend in the fifth direction Y2. The second gate structures 220_1 and 220_2 may intersect the second fin-type pattern 210. The second gate structures 220_1 and 220_2 may intersect the second nanosheets 215_1 and 215_2, which are spaced apart from each other in the fourth direction X2. The second gate structures 220_1 and 220_2 may surround the second nanosheets 215_1 and 215_2, which are spaced apart from each other in the fourth direction X2.

Each of the second gate structures 220_1 and 220_2 may include a second gate electrode 225, a second gate insulating film 230, second gate spacers 240, and a second gate trench 240t.

The second gate spacers 240 may extend lengthwise in the fifth direction Y2. The second gate spacers 240 may define the second gate trench 240t, which intersects the second nanosheets 215_1 and 215_2. The second gate spacers 240 may include second inner spacers 242 and second outer spacers 241.

The second gate insulating film 230 may be formed along the edges of the respective second nanosheets 215_1 and 215_2. The second gate insulating film 230 may surround the respective second nanosheets 215_1 and 215_2.

The second gate electrode 225 may intersect the second nanosheets 215_1 and 215_2, which are spaced apart from the substrate 100, and the second fin-type pattern 210. The second gate electrode 225 may surround the respective second nanosheets 215_1 and 215_2. The second gate electrode 225 may also be formed in a gap between the second nanosheets 215_1 and 215_2 and the second fin-type pattern 210.

The second epitaxial pattern 250 may be formed between the second gate structures 220_1 and 220_2, which are adjacent to each other. The second epitaxial pattern 250 may be formed on the second fin-type pattern 210. The second epitaxial pattern 250 may be formed by epitaxial growth.

The second nanosheets 215_1 and 215_2 may be disposed on both sides of the second epitaxial pattern 250. The second epitaxial pattern 250 may be connected to the second nanosheets 215_1 and 215_2.

The second epitaxial pattern 250 may be included in sources/drains that use the second nanosheets 215_1 and 215_2 as channel regions. For example, since the second nanosheets 215_1 and 215_2 can be used as the channel regions of PMOS transistors, the second epitaxial pattern 250 may be included in the sources/drains of the PMOS transistors.

The second epitaxial pattern 250 may include third and fourth epitaxial sidewalls 251s and 252s which extend from the second fin-type pattern 210. The third epitaxial sidewall 251s may extend from the first fin sidewall 210a of the second fin-type pattern 210. The fourth epitaxial sidewall 252s may extend from the second sidewall 210b of the second fin-type pattern 210.

The third epitaxial sidewall 251s may include a third epitaxial lower sidewall 251sl and a third epitaxial upper sidewall 251su. The third epitaxial lower sidewall 251sl and the third epitaxial upper sidewall 251su may be sequentially located from the first fin sidewall 210a of the second fin-type pattern 210.

The third epitaxial lower sidewall 251sl may extend from the first fin sidewall 210a of the second fin-type pattern 210. The third epitaxial lower sidewall 251sl may be connected to the first fin sidewall 210a of the second fin-type pattern 210.

The fourth epitaxial sidewall 252s may include a fourth epitaxial lower sidewall 252sl and a fourth epitaxial upper sidewall 252su. The fourth epitaxial lower sidewall 252sl and the fourth epitaxial upper sidewall 252su may be sequentially located from the second fin sidewall 210b of the second fin-type pattern 210.

The fourth epitaxial lower sidewall 252sl may extend from the second fin sidewall 210b of the second fin-type pattern 210. The fourth epitaxial lower sidewall 252sl may be connected to the second fin sidewall 210b of the second fin-type pattern 210.

The third epitaxial lower sidewall 251sl may be directly connected to the third epitaxial upper sidewall 251su. The fourth epitaxial lower sidewall 252sl may be directly connected to the fourth epitaxial upper sidewall 252su.

The top surface of the second fin-type pattern 210 may be on a level with the top surface of the field insulating film 105 at a location where the second fin-type pattern 210 and the field insulating film 105 meet.

The third and fourth epitaxial sidewalls 251s and 252s may not be covered by the field insulating film 105.

The second epitaxial pattern 250 may include a second epitaxial bottom surface 250bs which connects the third and fourth epitaxial sidewalls 251s and 252s.

The second epitaxial bottom surface 250bs may be disposed between the third and fourth epitaxial lower sidewalls 251sl and 252sl. The second epitaxial bottom surface 250bs may connect the third and fourth epitaxial lower sidewalls 251sl and 252sl. The second epitaxial bottom surface 250bs may contact the top surface of the second fin-type pattern 210. The second epitaxial bottom surface 250bs may face the top surface of the second fin-type pattern 210. The second epitaxial bottom surface 250bs may be a portion of the second epitaxial pattern 250 that vertically overlaps with the top surface of the second fin-type pattern 210.

The third and fourth epitaxial upper sidewalls 251su and 252su may be inclined surfaces that are inclined with respect to the top surface of the substrate 100. The distance between the third and fourth epitaxial upper sidewalls 251su and 252su may decrease in a direction extending away from the second fin-type pattern 210 (e.g., the sixth direction Z2). For example, the distance between the third and fourth epitaxial upper sidewalls 251su and 252su, which is measured in the fifth direction Y2, may decrease as the distance from the second fin-type pattern 210 increases in the sixth direction Z2. The third and fourth epitaxial lower sidewalls 251sl and 252sl may be inclined surfaces that are inclined with respect to the top surface of the substrate 100. The distance between the third and fourth epitaxial lower sidewalls 251sl and 252sl may increase in a direction extending away from the second fin-type pattern 210 (e.g., the sixth direction Z2). For example, the distance between the third and fourth epitaxial lower sidewalls 251*sl* and 252*sl*, which is measured in the fifth direction Y2, may increase as the distance from the second fin-type pattern 210 increases in the sixth direction Z2.

The third and fourth epitaxial upper sidewalls 251*su* and 252*su* may be formed of crystal planes included in a fifth crystal plane group. The third and fourth epitaxial lower sidewalls 251*sl* and 252*sl* may be formed of crystal planes included in a sixth crystal plane group.

The fifth and sixth crystal plane groups may be the same. For example, the fifth crystal plane group may be a {111} crystal plane group, and the sixth crystal plane group may be a {111} crystal plane group.

The second epitaxial pattern 250, unlike the first epitaxial pattern 150, may not include epitaxial connecting sidewalls having crystal planes included in a {110} crystal plane group. The second epitaxial pattern 250 may not include an epitaxial top surface having a crystal plane included in a {100} crystal plane group.

First and second epitaxial sidewalls 151*s* and 152 of the first epitaxial pattern 150 may include non-saturated crystal planes.

Alternatively to what is illustrated in FIGS. 19 through 21, corners where the third epitaxial upper sidewall 251*su* and the third epitaxial lower sidewall 251*sl* meet and where the fourth epitaxial upper sidewall 252*su* and the fourth epitaxial lower sidewall 252*sl* meet may be rounded. Also, a corner where the third and fourth epitaxial upper sidewalls 251*su* and 252*su* meet may be rounded.

This is not necessarily because the third and fourth epitaxial sidewalls 251*s* and 252*s* include non-saturated crystal planes, but because the corners of the second epitaxial pattern 250 are trimmed during the formation of the second epitaxial pattern 250.

Alternatively to what is illustrated in FIGS. 19 through 21, in some embodiments, the substrate 100 may be an SOI or SGOI substrate having a buried insulating film formed on a semiconductor base substrate.

Alternatively to what is illustrated in FIGS. 19 through 21, in some embodiments, the first gate structures 120_1 and 120_2 and the second gate structures 220_1 and 220_2 may each further include a capping pattern (e.g., capping pattern 145 of FIG. 18) which is formed on a first gate electrode 125 or the second gate electrode 225.

Figure 22:
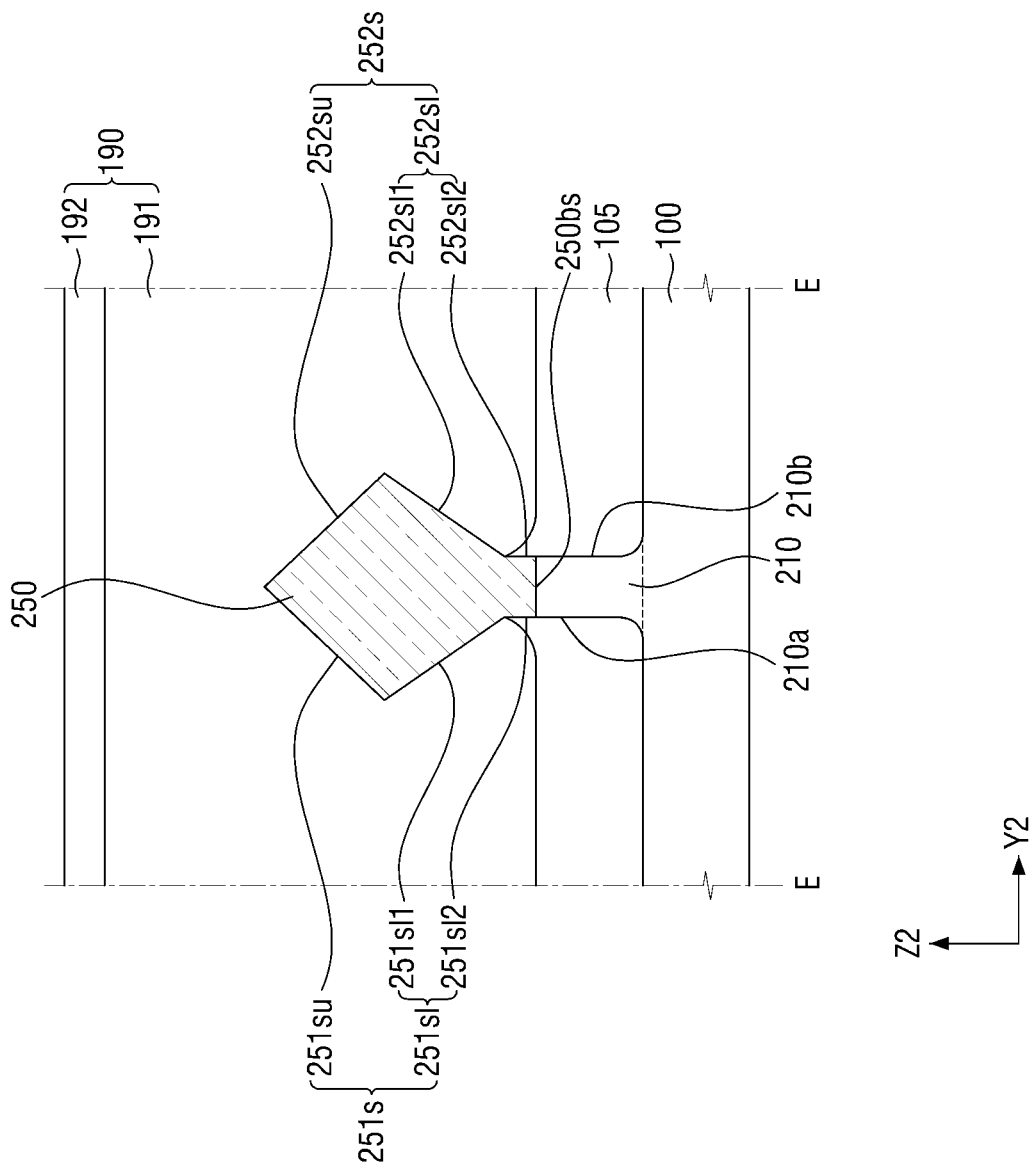
FIG. 22 is a cross-sectional view illustrating a semiconductor device according to some embodiments of the present inventive concept.

FIG. 22 is a cross-sectional view illustrating a semiconductor device according to some example embodiments of the present inventive concept. For convenience, the semiconductor device of FIG. 22 will hereinafter be described, focusing mainly on the differences with the semiconductor device of FIGS. 19 through 21.

Referring to FIG. 22, third and fourth epitaxial sidewalls 251*s* and 252*s* may be partially covered by a field insulating film 105.

The third epitaxial lower sidewall 251*sl* may include first and second portions 251*sl*/1 and 251*sl*/2. The second portion 251*sl*/2 of the third epitaxial lower sidewall 251*sl* may be a portion of the third epitaxial lower sidewall 251*sl* that extends from a first fin sidewall 210*a* of a second fin-type pattern 210. The first portion 251*sl*/1 of the third epitaxial lower sidewall 251*sl* may be disposed between the second portion 251*sl*/2 of the third epitaxial lower sidewall 251*sl* and a third epitaxial upper sidewall 251*su*.

The second portion 251*sl*/2 of the third epitaxial lower sidewall 251*sl* may be a portion of the third epitaxial lower sidewall 251*sl* that is covered by the field insulating film 105. For example, the field insulating film 105 may contact the second portion 251*sl*/2 of the third epitaxial lower sidewall 251*sl*. The first portion 251*sl*/1 of the third epitaxial lower sidewall 251*sl* may be a portion of the third epitaxial lower sidewall 251*sl* that extends beyond the top surface of the field insulating film 105.

A fourth epitaxial lower sidewall 252*sl* may include first and second portions 252*sl*/1 and 252*sl*/2. The second portion 252*sl*/2 of the fourth epitaxial lower sidewall 252*sl* may be a portion of the fourth epitaxial lower sidewall 252*sl* that extends from a second fin sidewall 210*b* of the second fin-type pattern 210. The first portion 252*sl*/1 of the fourth epitaxial lower sidewall 252*sl* may be disposed between the second portion 252*sl*/1 of the fourth epitaxial lower sidewall 252*sl* and a second epitaxial upper sidewall 252*sc*.

The second portion 252*sl*/2 of the fourth epitaxial lower sidewall 252*sl* may be a portion of the fourth epitaxial lower sidewall 252*sl* that is covered by the field insulating film 105. For example, the field insulating film 105 may contact the second portion 252*sl*/2 of the fourth epitaxial lower sidewall 252*sl*. The first portion 252*sl*/1 of the fourth epitaxial lower sidewall 252*sl* may be a portion of the fourth epitaxial lower sidewall 252*sl* that extends beyond the top surface of the field insulating film 105.

For example, the first portion 251*sl*/1 of the third epitaxial lower sidewall 251*sl* and the first portion 252*sl*/1 of the fourth epitaxial lower sidewall 252*sl* may be formed of crystal planes included in a {111} crystal plane group.

The crystal plane group that forms the first portion 251*sl*/1 of the third epitaxial lower sidewall 251*sl* and the first portion 252*sl*/1 of the fourth epitaxial lower sidewall 252*sl* may be the same as the crystal plane group that forms the third and fourth epitaxial upper sidewalls 251*su* and 252*su*.

Figure 23:
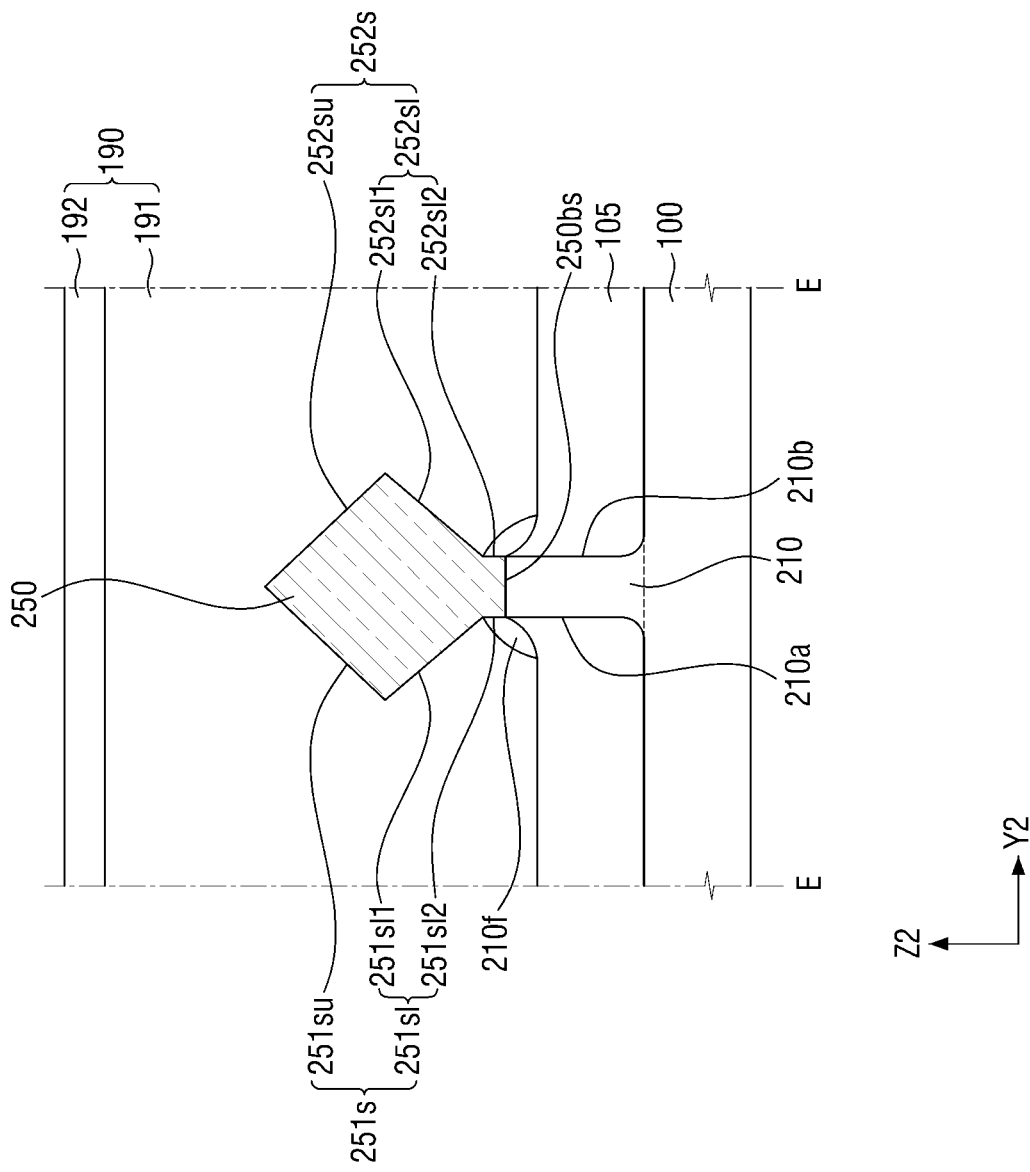
FIG. 23 is a cross-sectional view illustrating a semiconductor device according to some embodiments of the present inventive concept.

FIG. 23 is a cross-sectional view illustrating a semiconductor device according to some example embodiments of the present inventive concept. For convenience, the semiconductor device of FIG. 23 will hereinafter be described, focusing mainly on the differences with the semiconductor device of FIGS. 19 through 21.

Referring to FIG. 23, the semiconductor device may further include second epitaxial spacers 210*f* which are disposed on a field insulating film 105. Portions of the second epitaxial spacers 210*f* may be disposed at first and second fin sidewalls 210*a* and 210*b* of a second fin-type pattern 210.

A second portion 251*sl*/2 of a third epitaxial lower sidewall 251*sl* may be a portion of the third epitaxial lower sidewall 251*sl* that is covered by a first one of the second epitaxial spacers 210*f*. In some embodiments, the first one of the second epitaxial spacer 210*f* may contact the second portion 251*sl*/2 of a third epitaxial lower sidewall 251*sl*. A first portion 251*sl*/1 of the third epitaxial lower sidewall 251*sl* may be a portion of the third epitaxial lower sidewall 251*sl* that extends beyond the top surfaces of the second epitaxial spacers 210*f*.

A second portion 252*sl*/2 of a fourth epitaxial lower sidewall 252*sl* may be a portion of the fourth epitaxial lower sidewall 252*sl* that is covered by a second one of the second epitaxial spacers 210*f*. In some embodiments, the second one of the second epitaxial spacer 210*f* may contact the second portion 252*sl*/2 of a fourth epitaxial lower sidewall 252*sl*. A first portion 252*sl*/1 of the fourth epitaxial lower sidewall 252*sl* may be a portion of the fourth epitaxial lower sidewall 252*sl* that extends beyond the top surfaces of the second epitaxial spacers 210*f*.

In concluding the detailed description, those skilled in the art will appreciate that many variations and modifications may be made to the preferred embodiments without substantially departing from the principles of the present inven-

What is claimed is:

1. A semiconductor device comprising:
a first active region disposed in a first region of a substrate and including first and second sidewalls which extend in a first direction;
a second active region disposed in a second region of the substrate and including third and fourth sidewalls which extend in a second direction;
a first epitaxial pattern disposed on the first active region; and
a second epitaxial pattern disposed on the second active region,
wherein the first epitaxial pattern includes first and second epitaxial sidewalls which extend from the first and second sidewalls, respectively, of the first active region,
wherein the first epitaxial sidewall includes a first epitaxial lower sidewall, a first epitaxial upper sidewall, and a first epitaxial connecting sidewall which connects the first epitaxial lower sidewall and the first epitaxial upper sidewall,
wherein the second epitaxial sidewall includes a second epitaxial lower sidewall, a second epitaxial upper sidewall, and a second epitaxial connecting sidewall which connects the second epitaxial lower sidewall and the second epitaxial upper sidewall,
wherein the second epitaxial pattern includes third and fourth epitaxial sidewalls which extend from the third and fourth sidewalls, respectively, of the second active region,
wherein the third epitaxial sidewall includes a third epitaxial lower sidewall and a third epitaxial upper sidewall which is directly connected to the third epitaxial lower sidewall,
wherein the fourth epitaxial sidewall includes a fourth epitaxial lower sidewall and a fourth epitaxial upper sidewall which is directly connected to the fourth epitaxial lower sidewall,
wherein the first to fourth epitaxial upper sidewalls and the third and fourth epitaxial lower sidewalls are formed by crystal planes included in a first crystal plane group, and
wherein the first and second epitaxial lower sidewalls are formed by crystal planes included in a second crystal plane group,
wherein the first crystal plane group is one of a {111} crystal plane group, a {110} crystal plane group, or a {100} crystal plane group,
wherein the second crystal plane group is one of a {111} crystal plane group, a {110} crystal plane group, or a {100} crystal plane group, and is different from the first crystal plane group.

2. The semiconductor device of claim 1, wherein the first crystal plane group is a {111} crystal plane group.

3. The semiconductor device of claim 1, wherein the first and second epitaxial connecting sidewalls are formed by crystal planes included in a third crystal plane group which is different from the first and second crystal plane groups.

4. The semiconductor device of claim 1, wherein a width of the first active region in a third direction that intersects the first direction is greater than a width of the second active region in a fourth direction that intersects the second direction.

5. The semiconductor device of claim 1, wherein the first and second regions are P-type metal oxide semiconductor (PMOS) regions.

6. The semiconductor device of claim 1,
wherein a distance between the first and second epitaxial sidewalls in a third direction intersecting the first direction decreases as a distance from the first active region increases in a fourth direction, which is perpendicular to the first and third direction, and
wherein a distance between the third and fourth epitaxial sidewalls in a fifth direction intersecting the second direction decreases as a distance from the second active region increases in a sixth direction, which is perpendicular to the second and fifth direction.

7. The semiconductor device of claim 6, wherein each of the first and second epitaxial lower sidewalls are parallel to a top surface of the substrate.

8. The semiconductor device of claim 1, wherein the first active region includes a planar top surface which connects the first and second sidewalls.

9. The semiconductor device of claim 1,
wherein the first and second epitaxial connecting sidewalls are formed by crystal planes included in a third crystal plane group, and
wherein the third crystal plane group is one of a {111} crystal plane group, a {110} crystal plane group, or a {100} crystal plane group, and is different from the first and second crystal plane groups.

* * * * *